(12) United States Patent
Menezes

(10) Patent No.: US 8,470,188 B2
(45) Date of Patent: Jun. 25, 2013

(54) NANO-IMPRINT LITHOGRAPHY TEMPLATES

(75) Inventor: Marlon Menezes, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 796 days.

(21) Appl. No.: 12/572,838

(22) Filed: Oct. 2, 2009

(65) Prior Publication Data

US 2010/0084376 A1    Apr. 8, 2010

Related U.S. Application Data

(60) Provisional application No. 61/110,047, filed on Oct. 31, 2008, provisional application No. 61/110,718, filed on Nov. 3, 2008, provisional application No. 61/104,814, filed on Oct. 13, 2008, provisional application No. 61/102,237, filed on Oct. 2, 2008.

(51) Int. Cl.
 *C23F 1/00* (2006.01)

(52) U.S. Cl.
 USPC .............................. 216/39; 438/758; 438/760

(58) Field of Classification Search
 USPC .................. 502/227; 438/758, 760, 427, 409, 438/424, 10; 101/463.1; 257/64; 216/52; 427/258
 See application file for complete search history.

(56) References Cited

U.S. PATENT DOCUMENTS

| | | | |
|---|---|---|---|
| 4,714,810 A | 12/1987 | Sirkis | |
| 5,028,511 A | 7/1991 | Choi | |
| 5,395,954 A | 3/1995 | Soria et al. | |
| 5,620,777 A | 4/1997 | Goto et al. | |
| 5,753,781 A | 5/1998 | Oxman et al. | |
| 5,792,550 A | 8/1998 | Phillips et al. | |
| 5,895,263 A | 4/1999 | Carter et al. | |
| 5,928,767 A | 7/1999 | Gebhardt et al. | |
| 6,200,736 B1 | 3/2001 | Tan | |
| 6,329,017 B1 | 12/2001 | Liu et al. | |
| 6,334,960 B1 | 1/2002 | Willson et al. | |
| 6,435,948 B1 | 8/2002 | Molnar | |
| 6,465,365 B1 | 10/2002 | Annapragada | |
| 6,483,174 B1 | 11/2002 | Crafts et al. | |
| 6,497,961 B2 | 12/2002 | Kang et al. | |
| 6,573,131 B2 | 6/2003 | Yan et al. | |
| 6,592,764 B1 | 7/2003 | Stucky et al. | |
| 6,660,245 B1 | 12/2003 | Gaynor et al. | |
| 6,790,790 B1 | 9/2004 | Lyons | |

(Continued)

FOREIGN PATENT DOCUMENTS

| EP | 2221664 | 8/2010 |
|---|---|---|
| KR | 20070031858 A | 8/2010 |

(Continued)

OTHER PUBLICATIONS

Xia et al., Soft Lithography, Angew. Chem. Int. Ed., ISSN 1433-7851; vol. 37, Jan. 1, 1998 , pp. 551-575.

(Continued)

*Primary Examiner* — Duy Deo
*Assistant Examiner* — Erin Bergner
(74) *Attorney, Agent, or Firm* — Cameron A. King

(57) ABSTRACT

Porous nano-imprint lithography templates may include pores, channels, or porous layers arranged to allow evacuation of gas trapped between a nano-imprint lithography template and substrate. The pores or channels may be formed by etch or other processes. Gaskets may be formed on an nano-imprint lithography template to restrict flow of polymerizable material during nano-imprint lithography processes.

3 Claims, 20 Drawing Sheets

U.S. PATENT DOCUMENTS

| | | | |
|---|---|---|---|
| 6,873,087 B1 | 3/2005 | Choi et al. |
| 6,932,934 B2 | 8/2005 | Choi et al. |
| 6,936,194 B2 | 8/2005 | Watts |
| 6,957,608 B1 | 10/2005 | Hubert et al. |
| 6,960,327 B2 | 11/2005 | Navrotsky et al. |
| 7,090,716 B2 | 8/2006 | McMackin et al. |
| 7,138,362 B2 | 11/2006 | Abe et al. |
| 7,141,188 B2 | 11/2006 | Li et al. |
| 7,157,036 B2 | 1/2007 | Choi et al. |
| 7,160,949 B2 | 1/2007 | Ota et al. |
| 7,253,130 B2 | 8/2007 | Chiang et al. |
| 7,303,989 B2 | 12/2007 | Boyanov et al. |
| 7,307,118 B2 | 12/2007 | Xu et al. |
| 7,314,792 B2 | 1/2008 | Kim et al. |
| 7,365,375 B2 | 4/2008 | Goodner et al. |
| 7,384,622 B2 | 6/2008 | Hata et al. |
| 7,405,459 B2 | 7/2008 | Ogihara et al. |
| 7,422,774 B2 | 9/2008 | Zheng et al. |
| 7,422,776 B2 | 9/2008 | Yim et al. |
| 7,629,272 B2 | 12/2009 | Waldfried et al. |
| 7,737,021 B1 | 6/2010 | Dakshina-Murthy et al. |
| 7,819,652 B2 | 10/2010 | Lee et al. |
| 2003/0054115 A1 | 3/2003 | Albano et al. |
| 2003/0127002 A1 | 7/2003 | Hougham et al. |
| 2004/0065252 A1 | 4/2004 | Sreenivasan et al. |
| 2004/0065976 A1 | 4/2004 | Sreenivasan et al. |
| 2004/0124566 A1 | 7/2004 | Sreenivasan et al. |
| 2004/0188381 A1 | 9/2004 | Sreenivasan et al. |
| 2004/0211754 A1 | 10/2004 | Sreenivasan |
| 2005/0187339 A1 | 8/2005 | Xu et al. |
| 2005/0230882 A1 | 10/2005 | Watts et al. |
| 2005/0238967 A1 | 10/2005 | Rogers et al. |
| 2006/0024976 A1 | 2/2006 | Waldfried et al. |
| 2006/0081557 A1 | 4/2006 | Xu et al. |
| 2007/0117408 A1 | 5/2007 | Nguyen et al. |
| 2007/0123059 A1 | 5/2007 | Haverty et al. |
| 2007/0160639 A1 | 7/2007 | Pantelidis et al. |
| 2007/0190777 A1 | 8/2007 | Jiang et al. |
| 2008/0000373 A1 | 1/2008 | Petrucci-Samija |
| 2008/0055581 A1 | 3/2008 | Rogers et al. |
| 2008/0143015 A1 | 6/2008 | Lee et al. |
| 2008/0160129 A1 | 7/2008 | Resnick et al. |
| 2008/0197513 A1 | 8/2008 | Restaino et al. |
| 2008/0199632 A1 | 8/2008 | Wolden et al. |
| 2009/0140458 A1 | 6/2009 | Xu et al. |
| 2009/0266418 A1 | 10/2009 | Hu et al. |
| 2010/0072671 A1 | 3/2010 | Schmid |
| 2010/0104852 A1 | 4/2010 | Fletcher et al. |
| 2010/0108639 A1 | 5/2010 | Kasono |
| 2010/0109201 A1 | 5/2010 | Fletcher et al. |
| 2011/0183027 A1 | 7/2011 | Miller et al. |
| 2011/0189329 A1 | 8/2011 | Miller et al. |

FOREIGN PATENT DOCUMENTS

| | | |
|---|---|---|
| WO | WO/97/06012 | 2/1997 |
| WO | WO 00/20290 | 1/2000 |
| WO | WO0002090 | 1/2000 |
| WO | WO 2005/036681 | 4/2005 |
| WO | WO 2006/044690 | 4/2006 |
| WO | WO 2008/053418 | 5/2008 |
| WO | WO 2008/126313 | 10/2008 |
| WO | WO 2009/067241 | 5/2009 |
| WO | WO 2010/047821 | 4/2010 |
| WO | WO 2011/004991 | 1/2011 |

OTHER PUBLICATIONS

International Search Report for Application No. PCT/US2011/022583, Aug. 10, 2011, 4 pages.

Chen et al., "Effect of Trimethylsilylation on the Film Stress of Mesoporous Silica Ultralow-$k$ Film Stacks," Electrochem. Solid-State Lett., 9:6 (2006) G215-G218.

Breck, Zeolite Molecular Sieves: Structure, Chemistry, and Use; John Wiley and Sons, New York, New York, 1974 (p. 637).

Shackelford, "Gas solubility in glasses—principles and structural implications," J. Non-Cryst. Solids 253 (1999) 231-241.

Boiko, "Migration Paths of Helium in $\alpha$-Quartz and Vitreous Silica from Molecular Dynamics Data," Glass Physics and Chemistry, 29:1 (2003) 42-48.

Zhang et al., "Highly Porous Polyhedral Silsesquixoane Polymers. Synthesis and Characterization," J. Am. Chem. Soc., 120 (1998) 8380-8391.

Peng et al., "Analysis of the gas transport performance through PDMS/PS composite membranes using the resistances-in-series model," J. Membrane Sci. 222 (2003) 225-234.

Prakash et al., "Small volume PCR in PDMS biochips with integrated fluid control and vapor barrier," Sensors and Actuators B 113 (2006) 398-409.

Yoda et al., "Properties of High-Performance Porous SiOC Low-$k$ Film Fabricated Using Electron-Beam Curing" Jpn. J. Appl. Phys. 44 (2005) 3872-3878.

Kulkarni et al., "Electrical and structural characteristics of chromium thin films deposited on glass and alumina substrates," Thin Solid Films 301 (1977): 17-22.

Mitra et al., "Synthesis and evaluation of pure-silica-zeolite BEA as low dielectric constant material for microprocessors," Ind. Eng. Chem. Res., 43:12 (2004) 2946-2949.

Bushan et al., "Friction and wear studies of silicon in sliding contact with thin film magnetic rigid disks," J. Mater. Res. 9 (1993) 1611-1628.

Li et al., "Mechanical Characterization of micro/nanoscale structures for MEMS/NEMS applications using nanoindentation techniques," Ultramicroscopy 97 (2003)481-494.

Devine et al., "On the structure of low-temperature PECVD silicon dioxide films," J. Electron. Mater. 19 (1990) 1299-1301.

Cao et al., "Density change and viscous flow during structural relaxation of plasma-enhanced chemical-vapor-deposited silicon oxide films," J. Appl. Phys. 96 (2004) 4273-4280.

Xia et al., "Sub-10-nm Self-Enclosed Self-Limited Nanofluidic Channel Arrays," Nano. Lett. 8:11 (2008) 3830-3833.

Johnson et al. "Effect of calcination and polycrystallization on mechanical properties of nanoporous MFI zeolites," Materials Science and Engineering A 456(2007) 58-63.

Dong et al. "Template-removal-associated microstructural development of porous-ceramic-supported MFI zeolite membranes," Microporous and Mesoporous Materials 34 (2000) 241-253.

Tang et al., "Microwave synthesis of MFI-type zeolite membranes by seeded secondary growth without the use of organic structure directing agents," Microporous and Mesoporous Materials 118:1-3 (2009) 224-231.

Thoma et al., "Vapor phase transport synthesis of zeolites from sol-gel precursors," Microporous and Mesoporous Materials 41 (2000) 295-305.

McLeary et al., "Zeolite-based films, membranes, and membrane reactors: progress and prospects," Microporous and Mesoporous Materials 90 (2006) 198-200.

Motuzas et al., "Ultra-rapid production of MFI membranes by coupling microwave-assisted synthesis with either ozone or calcination treatment," Microporous and Mesoporous Materials, 99:1-2 (2007) 197-205.

Kanezashi et al., "Template-free synthesis of MFI-type zeolite membranes: Permeation characteristics and thermal stability improvement of membrane structure," Journal of Membrane Science, 286: 1-2 (2006) 213-222.

Li et al., "Microwave synthesis of zeolite membranes: A review," Journal of Membrane Science, 316:1-2 (2008) 3-17.

Gualtieri et al., "The influence of heating rate on template removal in silicalite-1: An in-situ HT-XRPD study," Microporous and Mesoporous Materials 89:1-3 (2006) 1-8.

Li et al., "Effects of crystallinity in spin-on pure-silica-zeolite MFI low-dielectric-constant films," Advanced Functional Materials. 14:10 (2004) 1019-1024.

Liu et al., "Nanoporous zeolite thin film-based fiber intrinsic Fabry-Perot interferometric sensor for detection of dissolved organics in water," Sensors 6:8 (2006), 835-847.

Golden et al., "Designing Porous low-k Dielectrics," Semiconductor International, May 2001.

Levy et al., "A comparative study of plasma enhanced chemically vapor deposited Si-O-H and Si-N-C-H films using the environmentally benign precursor diethylsilane," Mater. Lett. 54 (2002) 1299-1301.

Stoney, "The tension of metallic films deposited by electrolysis," Proc. R. Soc. London, Ser. A 82 (1909) 172.

Padovani et al., "Chemically bonded porogens in methylsilsesquioxane: I. Structure and bonding," Journal of the Electrochemical Society, 149 (12) F161-F170 (2002).

Wolf et al., "Silicon Processing for the VLSI Era, vol. 1—Process Technology," pp. 407-413, Jan. 1, 1986.

Pham et al., "Direct Spray Coating of Photoresist," The 16th European Conference on Solid State Transducers, Sep. 16-18, 2002, Czech Republic.

International Search Report and Written Opinion for Application No. PCT/US05/37063 dated Jun. 14, 2006, 10 pages. (WO 2006/044690).

International Search Report and Written Opinion for Application No. PCT/US09/005775 dated Apr. 8, 2010, 12 pages. (WO 2010/047821).

International Search Report and Written Opinion for Application No. PCT/US08/12990 dated Feb. 25, 2009, 7 pages. (WO2009/067241).

Kim et al., "Fabrication of three-dimensional microstructures by soft molding," Appl. Phys. Lett., vol. 79, No. 14, Oct. 1, 2001, pp. 2285-2287.

Zhichao Song, "Study of demolding process in thermal imprint lithography via numerical simulation and experimental approaches," A Thesis submitted to graduate faculty of the Louisiana State University and Agricultural and Mechanical College in partial fulfillment of the requirements for the degree of Master of Science in Mechanical Engineering in the Department of Mechanical Engineering, Dec. 2007, 132 pages.

Dupont Zonyl UR, www.dupont.com/zonyl/pdf/UR.pdf; pp. 1-2, Jun. 21, 2003.

Parsettensite mineral data, www.webmineral.com/data/parsettensite.shtml; pp. 1-5, Aug. 17, 2001.

Thiele, International Search Report for Application No. PCT/US2011/023193, Aug. 19, 2011.

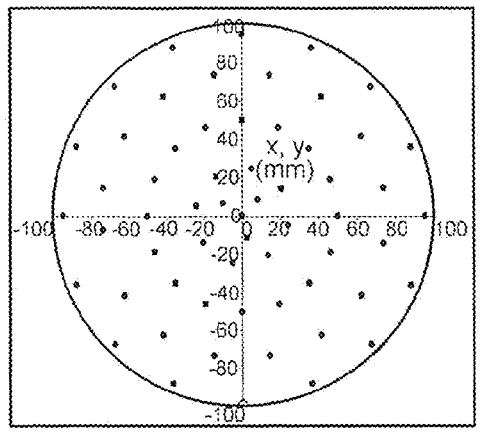 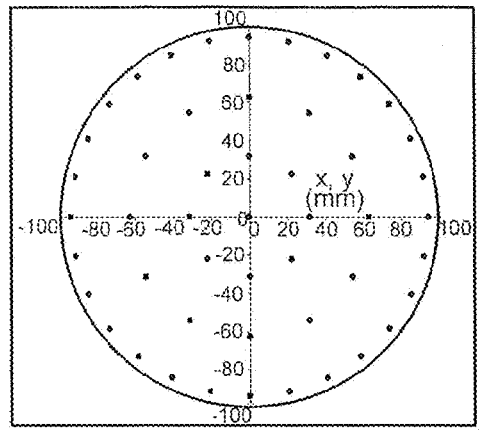
FIG. 19A                FIG. 19B
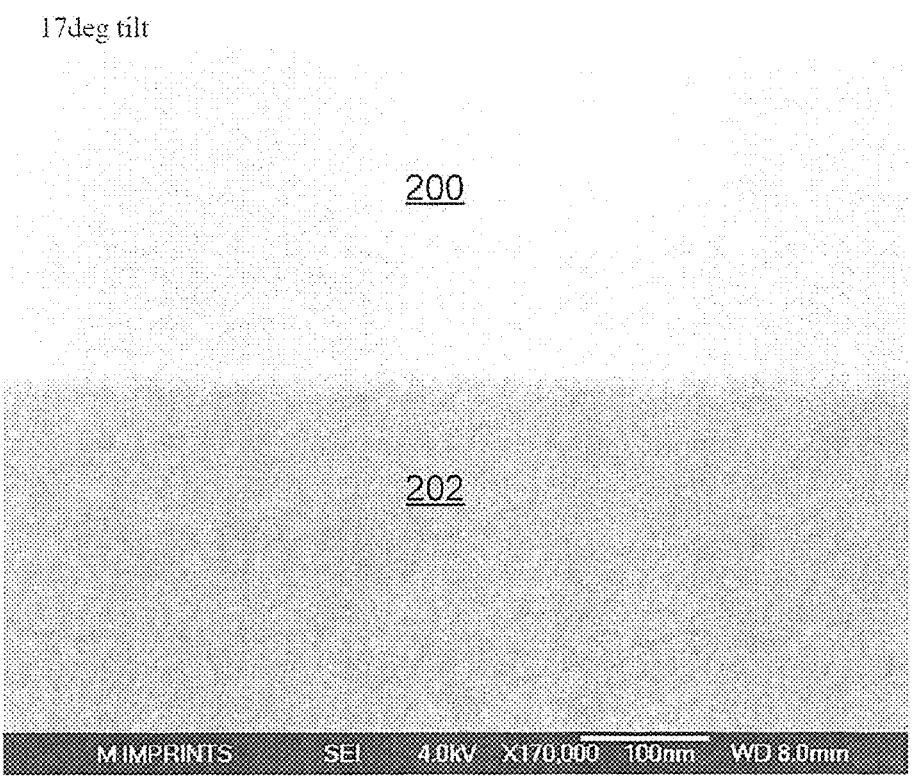
FIG. 20

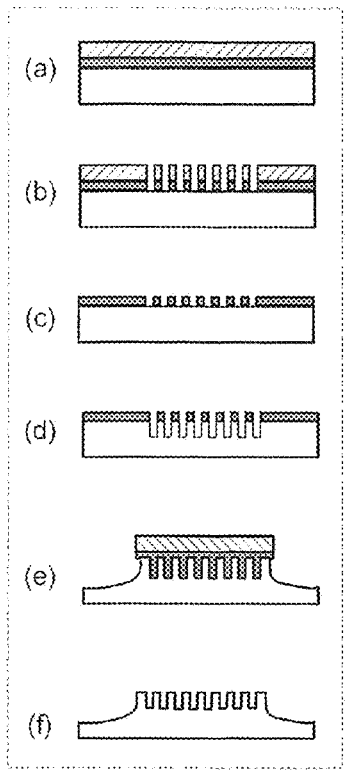
FIG. 21A
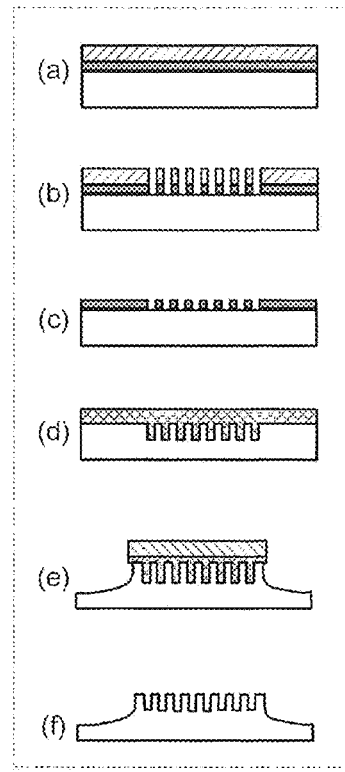
FIG. 21B
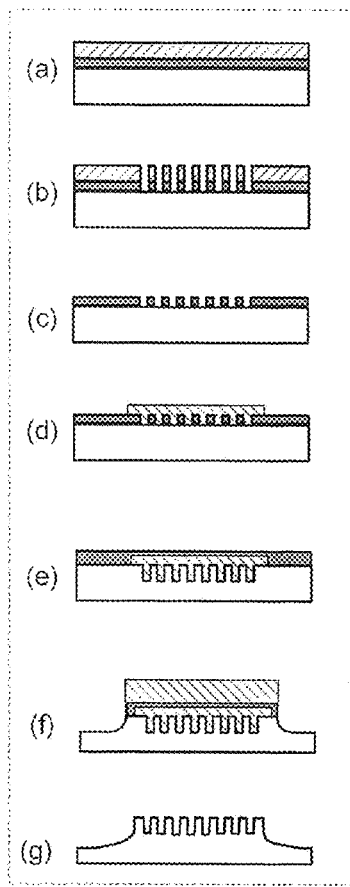
FIG. 21C
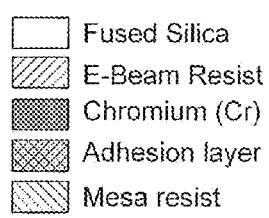
Fused Silica
E-Beam Resist
Chromium (Cr)
Adhesion layer
Mesa resist

NANO-IMPRINT LITHOGRAPHY TEMPLATES

CROSS-REFERENCE TO RELATED APPLICATIONS

This application claims the benefit under 35 U.S.C. §119 (e)(1) of U.S. Provisional Patent Application Ser. Nos. 61/102,237, filed Oct. 2, 2008; 61/104,814 filed Oct. 13, 2008; 61/110,047 filed Oct. 31, 2008; and 61/110,718, filed Nov. 3, 2008, all of which are hereby incorporated by reference herein.

TECHNICAL FIELD

The present invention relates to nano-imprint lithography templates.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

A nano-fabrication technique in use today is commonly referred to as imprint lithography. Examples of imprint lithography processes are described in detail in numerous publications, such as U.S. Patent Publication No. 2004/0065976, U.S. Patent Publication No. 2004/0065252, and U.S. Pat. No. 6,936,194, all of which are herein incorporated by reference.

An imprint lithography technique disclosed in each of the aforementioned U.S. patent publications and patent includes formation of a relief pattern in a polymerizable layer, and transferring a pattern corresponding to the relief pattern into an underlying substrate. The substrate may be coupled to a motion stage to obtain a desired positioning to facilitate the patterning process. The patterning process uses a template spaced apart from the substrate, and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY

In one aspect, a method of forming a porous nano-imprint lithography template includes disposing a layer of silicon on a fused silica nano-imprint lithography substrate, forming a multiplicity of protrusions and recesses in the silicon layer, irradiating the protrusions with electromagnetic radiation to liquefy a portion of the silicon, such that the silicon forms a layer substantially covering the recesses, oxidizing the silicon layer to form a silicon oxide layer, and forming a pattern in the silicon oxide layer.

In some implementations, the electromagnetic radiation includes laser irradiation with a pulse length of less than about 100 nanoseconds. The covered recesses may define openings with a dimension less than about 10 nm. In certain cases, oxidizing includes heating.

In another aspect, a nano-imprint lithography template includes a nano-imprint lithography substrate layer, a patterned nano-imprint lithography substrate layer, and a multiplicity of posts extending between the substrate layer and the patterned substrate layer. The patterned substrate layer is permeable to a gas, and spacings between the posts define reservoirs capable of accepting the gas.

In some implementations, the posts have a width between about 10 nm and about 1 μm and a height between about 1.0 nm and about 300 nm. A density of the posts may be between about 30% and about 70%. The patterned substrate layer may be bonded to the posts.

In another aspect, a method of forming a porous nano-imprint lithography template includes forming a nano-imprint lithography mask on a fused silica nano-imprint lithography template, etching the nano-imprint lithography template to form recesses in the template, adjusting a volume of the recesses, cleaning the nano-imprint lithography template, depositing a conformal oxide layer over the recesses, removing a top portion of the conformal oxide layer to leave conformal oxide plugs in the recesses, and etching the conformal oxide plugs to predetermined depth.

In some implementations, the side walls of the recesses may be protected before a volume of the recesses is adjusted. In certain cases, adjusting a volume of the recesses may include isotropically etching a bottom of the recesses to enlarge a volume of the recesses.

BRIEF DESCRIPTION OF THE DRAWINGS

FIGS. 19A-B illustrate assessment of adhesion layer thickness.

FIG. 20 is an SEM image showing a silicon wafer coated with a 1 nm thick layer.

FIGS. 21A-C illustrate steps in mesa formation.

DETAILED DESCRIPTION

Figure 1:
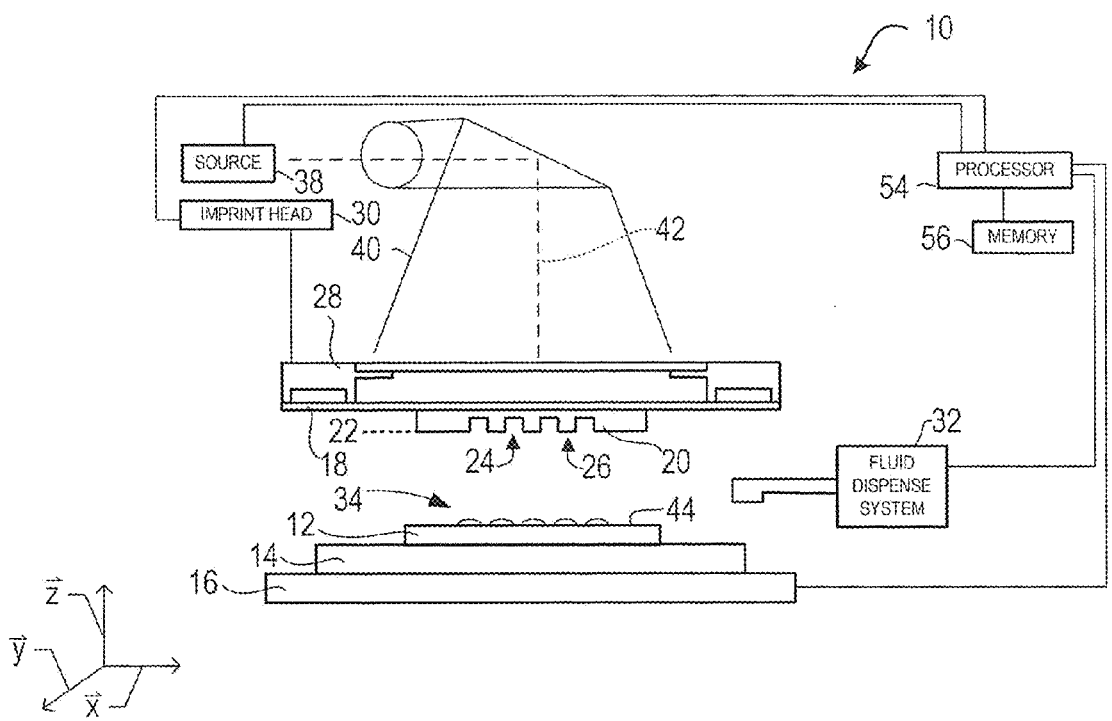
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is herein incorporated by reference.

Substrate 12 and substrate chuck 14 may be further supported by stage 16. Stage 16 may provide motion about the x, y, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 includes features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is herein incorporated by reference. Further, chuck 28 may be coupled to imprint head 30 such that chuck 28 and/or imprint head 30 may be configured to facilitate movement of template 18.

System 10 may further include a fluid dispense system 32. Fluid dispense system 32 may be used to deposit polymerizable material 34 on substrate 12. Polymerizable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may include a monomer as described in U.S. Pat. No. 7,157,036, and U.S. Patent Publication No. 2005/0187339, each of which is herein incorporated by reference.

Figure 2:
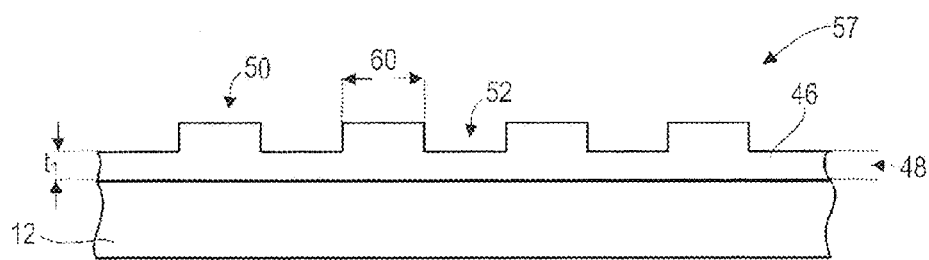
FIG. 2 illustrates a simplified side view of the substrate illustrated in FIG. 1, having a patterned layer thereon.

Referring to FIGS. 1 and 2, system 10 may further include an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34.

After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with residual layer having a thickness $t_1$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, all of which are herein incorporated by reference.

Gases may be present between the template and the substrate and even within the formable liquid. Such gases may result in pattern distortions in the solidified layer, low fidelity of features formed in the solidified layer, and/or the possibility of non-uniform thickness of a residual layer of the solidified layer. These gases may be; removed by diffusion of the gas into the substrate, the template, and/or the solidified layer.

The solidified layer may offer little volume for gas diffusion, and as such, the more significant reservoirs for diffusing gas may be in the substrate and template.

Templates may be modified with a material that increases the probability of gas diffusion. For example, films containing mesopores and/or micropores may be used to increase permeability. These films, however, may be weak and have an internal tensile stress that may lead to cracking or delaminating of the film.

In nano-imprint processes in which polymerizable material is applied to a substrate by drop dispense or spin coating methods, gases may be trapped inside recesses in the template after the template contacts the polymerizable material. In nano-imprint processes in which a multiplicity of drops of polymerizable material is applied to a substrate by drop dispense methods, gases may also be trapped between drops of polymerizable material or imprint resist dispensed on a substrate or on an imprinting stack. That is, gases may be trapped in interstitial regions between drops as the drops spread.

Figure 3:
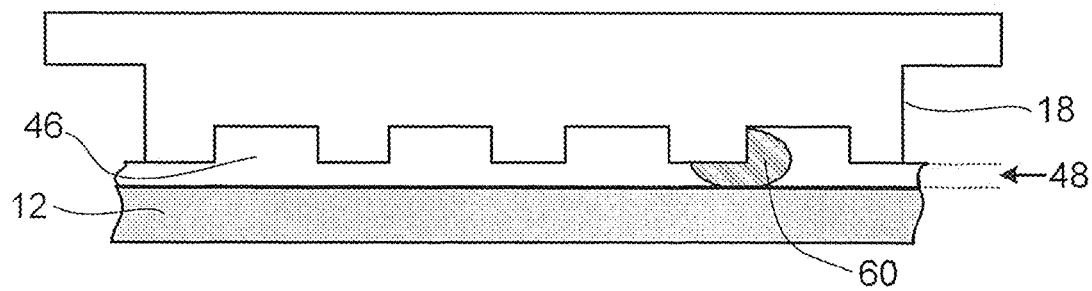
FIG. 3 illustrates a simplified side view of the volume, defined between the substrate and template of FIG. 1, having gases formed therein.

In the volume defined between substrate 12 and template 18, there may be gases and/or gas pockets present, as illustrated by FIG. 3. Gases and/or gas pockets are hereinafter referred to as gases 60. The gases 60 may include, but are not limited to, air, nitrogen, carbon dioxide, helium, and/or the like. Gases 60 between substrate 12 and template 18 may result in pattern distortion of features formed in patterned layer 46, low fidelity of features formed in patterned layer 46, non-uniform thickness of residual layer 48 across patterned layer 46, and/or the like.

Gas escape and dissolution rates may limit the rate at which the polymerizable material is able to form a continuous layer on the substrate (or imprinting stack) or the rate at which the polymerizable material is able to fill template features after the template contacts the polymerizable material, thereby limiting throughput in nano-imprint processes. For example, a substrate or a template may be substantially impermeable to a gas trapped between the substrate and the template. In some, cases, a polymeric layer adhered to the substrate or the template may become saturated with gas, such that gas between the imprinting stack and the template is substantially unable to enter the saturated polymeric layer, and remains trapped between the substrate and the substrate or imprinting stack. Gas that remains trapped between the substrate or the imprinting stack and the template may cause filling defects in the patterned layer.

In an imprint lithography process, gas trapped between the substrate/imprinting stack and the template may escape through an edge of the polymerizable material, the substrate/imprinting stack, the template, or any combination thereof. The amount of gas that escapes through any medium may be influenced by the contact area between the trapped gas and the medium. The contact area between the trapped gas and the polymerizable material that is not bounded by the template or the substrate may be less than the contact area between the trapped gas and the substrate/imprinting stack and less than the contact area between the trapped gas and the template. For example, a thickness of the polymerizable material on a substrate/imprinting stack may be less than about 1 μm, or less than about 100 nm, providing a small area for gas to escape through the polymerizable material without going through the template or the substrate. In some cases, a polymerizable material may absorb enough gas to become saturated with the gas before imprinting, such that trapped gas is substantially unable to enter the polymerizable material. In contrast, the contact area between the trapped gas and the substrate or imprinting stack, or the contact area between the trapped gas and the template, may be relatively large.

In some cases, the substrate/imprinting stack or template may include a porous material defining a multiplicity of pores with an average pore size and pore density or relative porosity selected to facilitate diffusion of a gas into the substrate/imprinting stack or the template, respectively. In certain cases, the substrate/imprinting stack or template may include one or more layers or regions of a porous material designed to facilitate transport of gases trapped between the substrate/imprinting stack and the template in a direction away from the polymerizable material between the substrate/imprinting stack and substrate and toward the substrate/imprinting stack or the template, respectively.

The gas permeability of a medium may be expressed as P=D×S, in which P is the permeability, D is the diffusion coefficient, and S is the solubility. In gas transport process, a gas adsorbs onto a surface of the medium, and a concentration gradient is established within the medium. The concentration gradient may serve, as the driving force for diffusion of gas through the medium. Gas solubility and the diffusion coefficient may vary based on, for example, packing density of the medium. Adjusting a packing density of the medium may alter the diffusion coefficient and hence the permeability of the medium.

A gas may be thought of as having an associated kinetic diameter. The kinetic diameter provides an idea of the size of the gas, atoms or molecules for gas transport properties. D. W. Breck, Zeolite Molecular Sieves—Structure, Chemistry, and Use, John Wiley &. Sons, New York, 1974, p. 636, which is hereby incorporated by reference herein) lists the kinetic diameter for helium (0.256 nm), argon (0.341 nm), oxygen (0.346 nm), nitrogen (0.364 nm), and other common gases.

In some imprint lithography processes, a helium purge is used to substantially replace air between the template and the substrate or imprinting stack with helium gas. To simplify the comparison between a helium environment and an air environment in an imprint lithography process, the polar interaction between oxygen in air and silica may be disregarded by modeling air as pure argon. Both helium and argon are inert gases, and argon has a kinetic diameter similar to that of oxygen. Unlike oxygen, however, helium and argon do not interact chemically with fused silica or quartz (e.g., in a template or substrate).

Internal cavities (solubility sites) and structural channels connecting the solubility sites allow a gas to permeate through a medium. The gas may be retained in the solubility sites. The size of the internal cavities and the channel diameter relative to the size (or kinetic diameter) of the gas influence the rate at which the gas permeates the medium.

The sizes of individual interstitial solubility sites of fused silica have been shown to follow a log-normal distribution by J. F. Shackelford in J. Non-Cryst. Solids 253, 1999, 23, which is hereby incorporated by reference herein. As indicated by the interstitial diameter distribution (mode=0.1.81 nm; mean=0.196 nm) and the kinetic diameter of helium and argon, the number of fused silica solubility sites available to helium exceeds the number of solubility sites available to argon. The total number of interstitial sites is estimated to be $2.2 \times 10^{28}$ per $m^3$, with $2.3 \times 10^{27}$ helium solubility sites per $m^3$ and $1.1 \times 10^{26}$ argon solubility sites per $m^3$. The average distance between solubility sites for helium is considered, to be 0.94 nm, while the average distance between solubility sites for argon is considered to be 2.6 nm. The structural channels connecting these solubility sites are thought to be similar to the helical arrangement of 6-member Si—O rings, with a diameter of about 0.3 nm. Table 1 summarizes some parameters affecting helium and argon permeability in fused silica.

TABLE 1

|  | Helium | Argon |
|---|---|---|
| Kinetic Diameter (nm) | 0.256 | 0.341 |
| Solubility Site Density (m$^{-3}$) | $2.3 \times 10^{27}$ | $1.1 \times 10^{26}$ |
| Distant Between Solubility Sites (nm) | 0.94 | 2.6 |
| Structural Channel Diameter Connecting Solubility Sites (nm) | ~0.3 | ~0.3 |

Boiko (G. G. Boiko, etc., Glass Physics and Chemistry, Vol. 29, No. 1, 2003, pp. 42-48, which is hereby incorporated by reference herein) describes behavior of helium in amorphous or vitreous silica. Within a solubility site, the helium atom vibrates at an amplitude allowed by the interstitial volume. The atom passes from interstice to interstice through channels, which may be smaller in diameter than the interstices.

The parameters listed in Table 1 indicate that argon permeability in fused silica may be very low or negligible at room temperature (i.e., the kinetic diameter of argon exceeds the fused silica channel size). Since the kinetic diameters of oxygen and nitrogen are larger than the kinetic diameter of argon, air may be substantially unable to permeate fused silica. On the other hand, helium may diffuse into and permeate fused silica. Thus, when a helium environment is used, rather than ambient air for a nano-imprint process, helium trapped between the template and the substrate or imprinting stack may be able to permeate a fused silica template.

Figure 4:
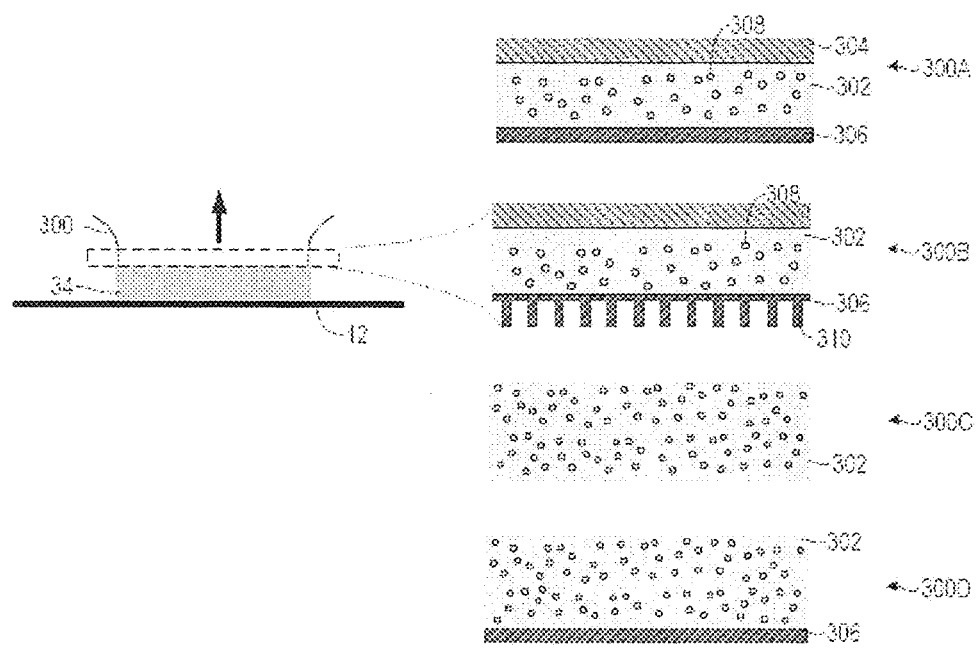
FIG. 4 illustrates magnified cross-sectional views of various porous templates.

FIG. 4 is a side view of polymerizable material 34 between substrate 12 and porous template 300, along with enlarged cross-sectional views of various porous template embodiments for use in nano-imprint lithography. The arrow indicates the direction of gas transport into template 300.

Template 300A includes a porous layer 302 between base layer 304 and cap layer 306. Porous layer 302 may be formed by chemical vapor deposition (CVD), spin-coating, thermal growth methods, or the like on base layer 304. A thickness of porous layer 302 may be at least about 10 nm. For example, a thickness of porous layer 302 may be in a range of about 10 nm to about 100 μm, or in a range of about 100 nm to about 10 μm. In some cases, a thicker porous layer 302 may provide higher effective permeability, without significantly reducing performance related to, for example, UV transparency, thermal expansion, etc.

Porous layer 302 may be made from materials including, but not limited to anodized a-alumina; organo-silane, organo-silica, or organosilicate materials; organic polymers; inorganic polymers, and any combination thereof. In some embodiments, the porous material may be low-k, porous low-k, or ultra-low-k dielectric film, such as spin-on glass (SOG) used in electronic and semiconductor applications. The porous material may be selected to withstand repeated use in nano-imprint lithography processes, including Piranha reclaim processes. Adhesion of the porous layer 302 to the base layer 304 and the cap layer 306 may be, for example, at least about three times the force required to separate the template from the patterned layer formed in an imprint lithography process. In some embodiments, the porous material may be substantially transparent to UV radiation. A tensile modulus of the porous material may be, for example, at least about 2 GPa, at least about 5 GPa, or at least about 10 GPa.

By varying the process conditions and materials, porous layers with different pore size and pore density (e.g., porosity or relative porosity) may be produced. In some cases, for example, ion bombardment may be used to form pores in a material. Porous layer 302 may have pores 308 with a larger pore size and a greater porosity than fused silica. As used herein, "porosity" refers to the fraction, as a percent of total volume, occupied by channels and open spaces in a solid. The porosity of porous layer 302 may range from about 0.1% to about 60%, or from about 5% to about 45%. In some cases, the porosity of porous layer 302 may be at least about 10% or at least about 20%. The relative porosity of similar materials may be defined as a relative difference in density of the materials. For example, a relative porosity of SOG (density $\rho_{SOG}$=1.4 g/cm$^3$) with respect to fused silica (density $\rho_{fused\ silica}$=2.2 g/cm$^3$) may be calculated as 100%×($\rho_{fused\ silica}$−$\rho_{SOG}$)/$\rho_{fused\ silica}$, or 36%. Fused silica may be used as a reference material for other materials including oxygen-silicon bonds. In some embodiments, a relative porosity of a porous material including oxygen-silicon bonds with respect to fused silica is at least about 10%, at least about 20%, or at least about 30%.

Sizes of the pores in a porous material may be well-controlled (e.g., substantially uniform, or with, a desired distribution). In some cases, a pore size or average pore size is less than about 10 nm, less than about 3 nm, or less than about 1 nm. In some cases, the pore size or average pore size is at least about 0.4 nm, at least about 0.5 nm, or larger. That is, the pore size or average pore size may be large enough to provide a sufficient number of solubility sites for a gas, such that the gas, when trapped between the substrate/imprinting stack and the template 300A, is able to diffuse into porous layer 302 of the template.

Porogens may be added to material used to form porous layer 302 to increase the porosity and pore size of the porous layer. Porogens include, for example, organic compounds that May be vaporized, such as norbornene, a-terpinene, polyethylene oxide, and polyethylene oxide/polypropylene oxide copolymer, and the like, and any combination thereof. Porogens may be, for example, linear or star-shaped. Porogens and process conditions May be selected to form a microporous low-k porous layer, for example, with an average pore diameter of less than about 2 nm, thereby increasing the number of solubility sites for a range of gases. In addition, the introduction of porogens and the increased porosity may enlarge the structure channels connecting gas solubility sites. For pore sizes of about 0.4 nm or greater, helium permeability of a low-k film may exceed helium permeability of vitreous fused silica.

Base layer 304 and cap layer 306 may be made of the same or different material. In some embodiments, base layer 304 may be fused silica and cap layer 306 may include SiO$_x$, with 1≦x≦2, grown through a vapor deposition method. A thickness and composition of cap layer 306 may be chosen to provide mechanical strength and selected surface properties, as well as permeability to gases that may be trapped between a substrate/imprinting stack and a template in an imprint lithography process. In some embodiments, a thickness of cap layer 306 is less than about 100 nm, less than about 50 nm, or less than about 20 nm. In an example, cap layer 306 is about 10 nm thick. Cap layer 306 may be formed by material selected to achieve desirable wetting and release performance during an imprint lithography process. Cap layer 306 may also inhibit penetration of polymerizable material 34 into the porous layer while allowing gas to diffuse through the cap layer and into the porous layer 302.

For a multi-layer film, effective permeability may be calculated from a resistance model, such gas an analog of an electric circuit described by F. Peng, et al. in *J. Membrane Sci.* 222 (2003) 225-234 and A. Ranjit Prakash, et al. in *Sensors and Actuators* B 113 (2006) 398-409, which are both hereby incorporated by reference herein. The resistance of a material to the permeation of a vapor is defined as the permeance resistance, $R_p$. For a two-layer composite film with layer thicknesses $l_1$ and $l_2$, and corresponding permeabilities $P_1$ and $P_2$, permeance resistance may be defined as $R_p$=Δp/J=1/[(P/l)A], in which Δp is the pressure difference across the film, J is the flux, and A is the area. The resistance model predicts $R_p$=$R_1$+$R_2$. When the cross-sectional area is the same for both materials 1 and 2, this may be rewritten as $(l_1+l_2)/P=l_1/P_1+l_2/P_2$.

For template 300A with, cap layer 306 of SiO$_x$ with a thickness of about 10 nm and permeability $P_1$, template permeability may be adjusted by selecting porosity and pore size of the porous layer 302. The effect of the permeability and thickness of porous layer 302 on the effective permeability of a multi-layer composite imprinting stack with a thickness of 310 nm is shown in Table 2.

TABLE 2

| Cap Layer Thickness (SiO$_x$), Permeability P$_1$ | Porous Layer Thickness, Permeability P$_2$ | Base Layer Thickness (SiO$_2$), Permeability P$_1$ | Permeability Ratio | Effective Permeability of the Total Stack |
|---|---|---|---|---|
| 10 nm | 300 nm | 0 | P$_2$ = 1000 P$_1$ | 30.1 P$_1$ |
| 10 nm | 200 nm | 100 nm | P$_2$ = 1000 P$_1$ | 2.8 P$_1$ |
| 10 nm | 100 nm | 200 nm | P$_2$ = 1000 P$_1$ | 1.5 P$_1$ |
| 10 nm | 300 nm | 0 | P$_2$ = 100 P$_1$ | 23.8 P$_1$ |

Table 2 suggests that increasing a thickness of the porous layer alone may yield a higher effective permeability than increasing the permeability of the porous layer alone. That is, for a porous layer thickness of 300 nm and a cap layer thickness of 10 nm, a ten-fold increase in permeability of the porous layer from 100P$_1$ to 1000P$_1$ increases the effective permeability from 23.8P$_1$ to 30.1P$_1$. For composite imprinting stacks with a porous layer thickness of 100 nm, 200 nm, and 300 nm and a cap layer thickness of 10 nm, the effective permeability increases twenty-fold, from 1.5P$_1$ to 2.8P$_1$ to 30.1P$_1$, respectively, over the 200 nm increase in porous layer thickness.

In another embodiment, protrusions 310 may extend from cap layer 306. In an example, template 300B may be formed by depositing a 500 nm thick porous layer (e.g., an organosilicate low-k film) on a base layer (e.g., quartz), and growing a 100 nm thick cap layer (e.g., SiO$_x$) on top of the porous layer. The cap layer is etched back to form protrusions 90 nm in height. As used herein, a thickness of cap layer 306 is considered independently of the height of the protrusions 310. Thus, the cap layer in this example is considered to be 10 nm thick, with protrusions 90 nm in height extending from the cap layer. At least about 50% of the template surface has a 10 nm thick covering of SiO$_x$ (i.e., about 50% of the template surface area is covered with protrusions) with a 500 nm thick porous layer underneath. Helium may diffuse more quickly through portions of the cap layer from which there are no protrusions, achieving an overall increase in helium permeability at least partially dependent on the thickness of the porous layer, the thickness of the cap layer, and the fraction of the surface area of the template free from protrusions.

A template may be formed as a unitary structure with a porosity and average pore size selected to allow diffusion of a gas. Templates made from, for example, organic polymers, inorganic materials (e.g., silicon carbide, doped silica, VYCOR®), and the like, or any combination thereof, may have a lower packing density, and therefore a higher gas (e.g., helium) permeability, than vitreous fused silica. FIG. 4 illustrates template 300C. Template 300C is essentially a single porous layer 302. The porous layer 302 is not adhered to a has layer. The porous layer may have an average pore size of at least about 0.4 nm and a porosity of at least about 10%.

Template 300D includes porous layer 302 with a cap layer 306. Cap layer 306 may be, for example, SiO$_x$. As with template 300C, the porous layer is not adhered to a bate layer. The cap later 306 may inhibit penetration of the polymerizable material into the porous material. The cap layer 306 may also impart desirable surface properties, mechanical properties, and the like to the template.

Figure 5:
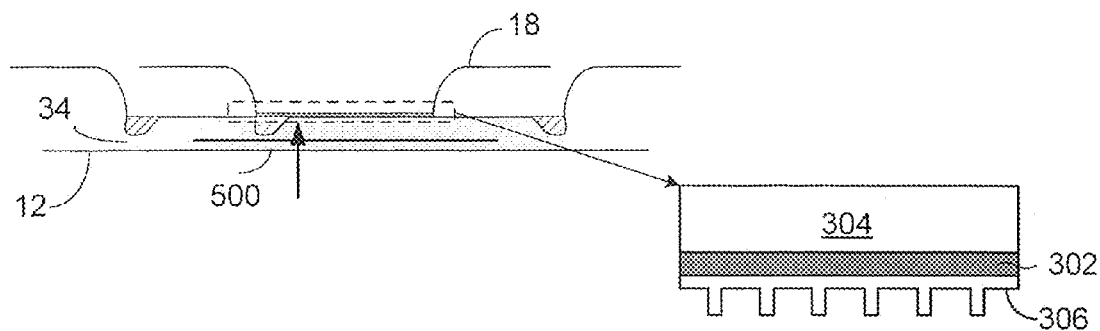
FIG. 5 illustrates a template with a mesoporous oxide layer.

Template-assisted mesoporous oxides are a class of materials that may be used as a porous layer in an nano-imprint lithography template to increase the permeability. FIG. 5 illustrates a nano-imprint lithography template 18 with a mesoporous oxide layer 302 between less porous layers 304 and 306. Organized assemblies of molecules are used to fabricate mesoporous inorganic oxides. The result is a mesoporous material having a highly ordered long-range structure that is amorphous at the atomic level. In some embodiments, an ordered mesoporous structure may be used in place of another porous material (e.g., zeolite) or to support a porous film (e.g., a zeolite film) when layers with different pore sizes are desired in the template construction. In this case, the mesoporous oxides may provide larger pore sizes than the zeolites. Pore sizes in mesoporous oxides may be controlled to range, for example, from about 2 nm in diameter to about 30 nm in diameter.

Self-assembling amphiphilic materials used as templates to create the ordered mesoporous structure may include surfactants and block co-polymers. The use of different templates like block copolymers (e.g., PEO-PPO-PEO, PEO-PBO-PEO), and methyl ammonium compounds (e.g., cetyltrimethyl ammonium bromide (CTAB) and cetyltrimethylammonium chloride (CTAC)) give rise to different mesoporous structures (e.g., 2-D hexagonal, 3-D cubic, lamellar, and the like). The template-assisted synthesis route allows the porosity, pore size, and pore shape to be controlled using the properties of the surfactants and block copolymers and their interactions with the inorganic species. By comparison, for disordered mesoporous oxides, the pore structure may be determined by the amount of precursor branching or aggregation (e.g., xerogels), or by the incorporation of sacrificial organic porogens in the sol that are later removed by thermolysis or plasma processing. For a given level of porosity, the control afforded by self-assembled templates may result in better mechanical properties. For example, smaller and more uniform pores may impart better mechanical properties than larger and non-uniform pores. Silica, alumina, and titania are examples of inorganic oxides that may be used to form a porous layer of a template by self-assembling materials. Examples of mesoporous silicas synthesized by the self-assembled template approach include MCM-41 (hexagonal phase), MCM-48 (cubic phase), and MCM-50 (lamellar phase).

Sol-gel synthesis and vapor phase synthesis may be used to fabricate ordered mesoporous oxides. The sol is a liquid solution including a soluble precursor of an inorganic material dissolved in a suitable solvent. Alkoxides, a family of sol-gel precursors, include metal atoms linked to organic ligands via oxygen bridges, such as tetraethoxysilane (TEOS), a precursor of silica (SiO$_2$).

Mechanical properties may vary based on porosity and synthesis method. U.S. Pat. No. 6,239,017, which is hereby incorporated by reference herein, describes a template-assisted mesoporous silica film with 55% porosity having an elastic modulus of 14-17 GPa as measured by nano-indentation.

A nano-imprint lithography template may be fabricated with an ordered mesoporous oxide. Dip coating and spin coating are examples of coating methods. An example of spin coating a silica precursor solution onto a 4" wafer and forming an ordered mesoporous silica film by using a surfactant template is disclosed in U.S. Pat. No. 6,239,017. A similar approach may be used to fabricate a nano-imprint lithography template with a porous layer including mesoporous silica. After forming the mesoporous silica film on the nano-imprint lithography template 18 (e.g., on layer 304 of the template), the silica surface may be polished to achieve a certain flatness. The porous layer may be capped with layer 306. Layer 306 may include a material suitable for lithography and patterning such as SiO$_2$ or SiC. For example, 100 nm of dense SiO$_2$ may be deposited by CVD on top of the mesoporous layer. The dense SiO$_2$ may then go through lithography and etch steps to define the pattern in the template. If the features are etched 90 nm deep, then 10 nm of CVD $SiO_2$ may reside on top of the mesoporous layer in the etched-back surfaces.

In some embodiments, an imprinting stack may include a substrate and a layer adhered to the substrate. Multi-layer imprinting stacks may include one or more additional layers adhered together to form a multi-layer composite. The substrate may be, for example, a silicon wafer. A layer adhered to the substrate may include, for example, organic polymeric material, inorganic polymeric material, or any combination thereof. Pore size and porosity of the substrate, the layers, or any combination thereof may be selected to allow diffusion of a gas (e.g., helium) through the imprinting stack, thus enhancing filling performance, by facilitating reduction of trapped gases and filling of features in the template during an imprint lithography process.

Figure 6:
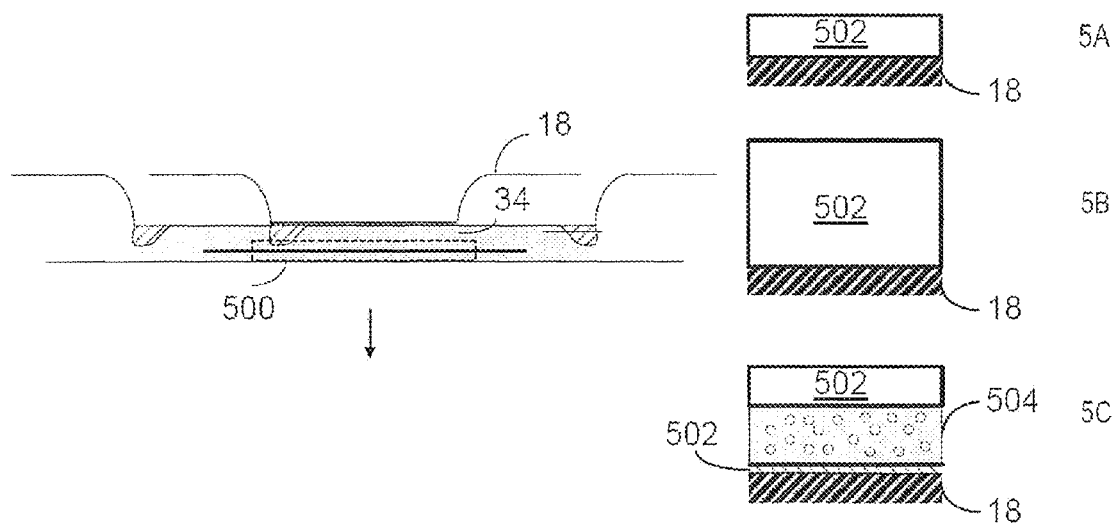
FIG. 6 illustrates magnified cross-sectional views of various imprinting stacks.

FIG. 6 illustrates polymerizable material 34 between template 18 and imprinting stack 500. The arrow indicates the direction of gas transport into the imprinting stack. Enlarged view 5A illustrates an imprinting stack 500 with substrate 12 and layer 502. Layer 502 may include one or more layers. Layer 502 is not considered to be a porous layer. Layer 502 may include an organic layer. In soma cases, a silicon wafer may block helium diffusion, and an organic stack above the silicon may be saturated by helium during a helium purge at the helium pressure used for purging. In some embodiments, as shown by enlarged view 5B, an increased stack thickness may reduce the probability of helium saturation during the helium purge, and thus improve helium absorption capacity. However, the overall stack thickness may need to be in the range of tens of microns before significant impact can be seen. In enlargement 5C, a porous layer 504 may be included in the stack. Porous layer 504 may be, for example, a low-k layer. A thickness of the porous layer 504 may be in the range of 50 nm to few microns depending on the desired use. Pore size control may be a factor in some applications (e.g., fabrication of compact discs) in which, for example, a large pore size is disadvantageous.

In some embodiments, a porous template and a porous imprinting substrate may be used together. For example, a helium-permeable layer may be included in the template and the imprinting substrate. Introducing a porous layer in a template, an imprinting substrate, or a combination thereof may allow some nitrogen and oxygen (e.g., in the air) to escape through the porous layer if the $SiO_2$ cap layer is sufficiently thin. This may relax some of the requirements of the helium purge (e.g., a reduced-purity helium may be acceptable).

Figure 7:
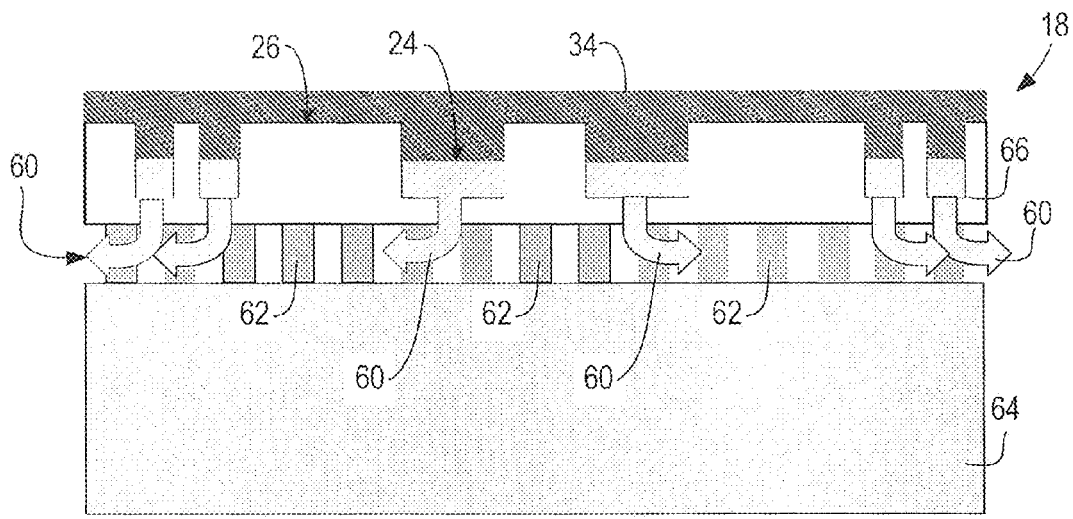
FIG. 7 illustrates a schematic side view of gas flow through a template.

In other embodiments, as illustrated in FIG. 7, template 18 may include a layer of posts 62 between a substrate layer 64 and a patterned substrate layer 66. Gases 60 may penetrate the patterned substrate layer 66 and flow to the layer with posts 62. Posts 62 provide interconnected open space to which gases 60 may flow to and ultimately into the atmosphere or an exhaust system.

Figure 8:
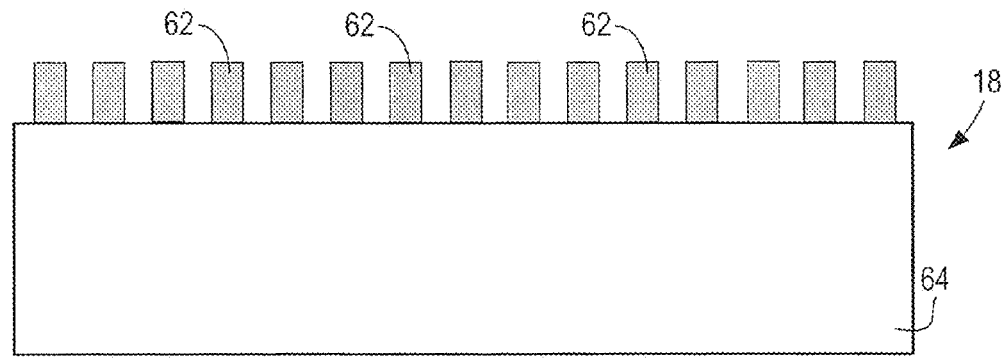
FIG. 8 illustrates a simplified side view of a template having posts formed therein.
Figure 9:
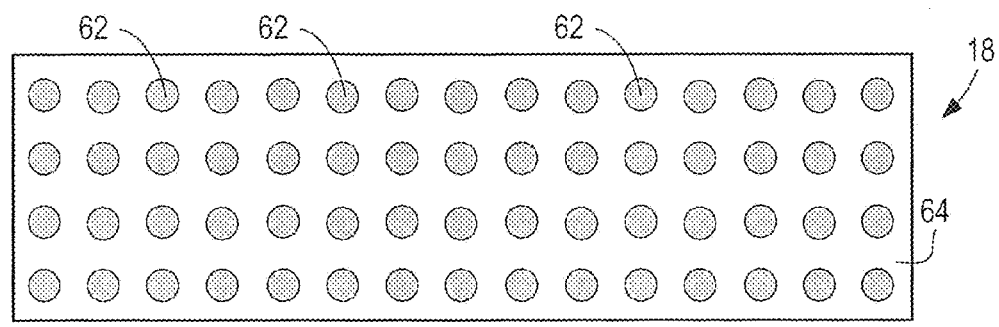
FIG. 9 illustrates a top down view of the template illustrated in FIG. 5.

FIGS. 8 and 9 illustrate an embodiment with a layer of posts 62 formed on substrate layer 64. Posts 62 may be formed of materials including, but not limited to fused-silica, quartz, silicon, organic polymers, siloxane polymers, borosilicate glass, fluorocarbon polymers, metal, hardened sapphire, and/or any other suitable material that is transparent to UV light necessary for polymerization. Posts 62 may be defined in any pattern or arbitrary arrangement that allows gases 60 to flow therebetween. For example, FIG. 9 illustrates posts 62 in a square array.

Figure 10:
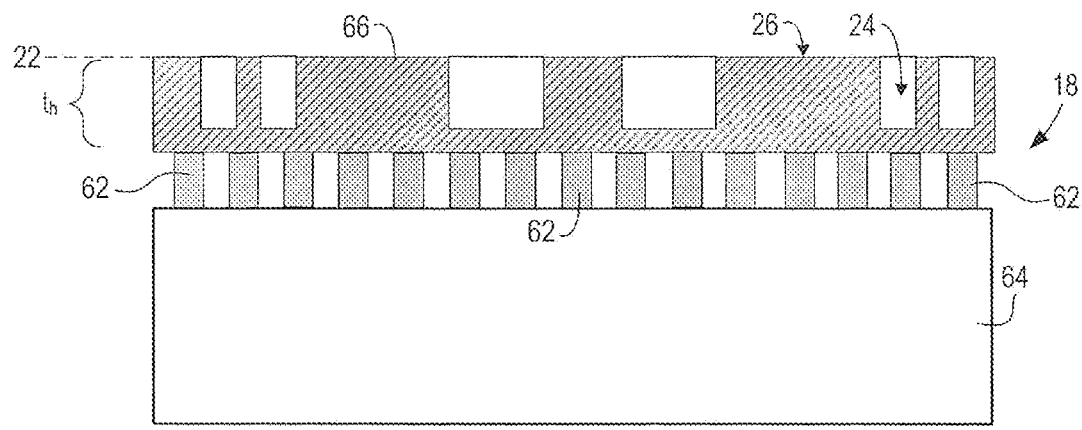
FIG. 10 illustrates a simplified side view of a template having posts formed therein.
Figure 11:
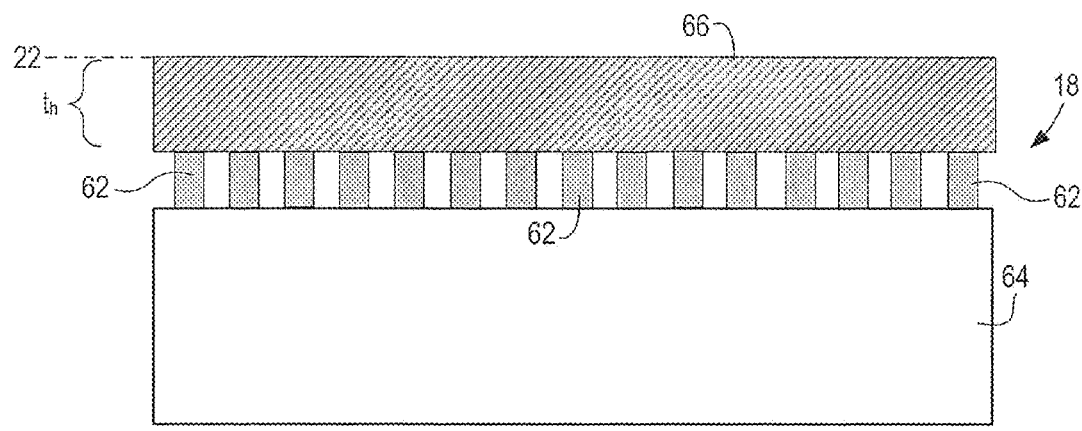
FIG. 11 illustrates a simplified side view of a template having posts formed therein.

Referring to FIGS. 10 and 11, patterned substrate layer 66 may be formed of material having a standard helium permittivity. For example, patterned substrate layer 66 may be formed of material including, but not limited to, fused-silica, quartz, silicon, organic polymers, siloxane polymers, borosilicate glass, fluorocarbon polymers, metal, hardened sapphire, and/or the like. In some cases, patterned substrate layer 66 may include patterning surface 22 and have a thickness $t_h$. Patterning surface 22 may include features 24 and 26 (as illustrated in FIG. 10), though patterning surface 22 may be featureless (as illustrated in FIG. 11) depending on design considerations. Permeation of gases 60 may be limited by the thickness $t_h$ for unpatterned substrate layer 66. For example, regarding density of gas flow:

$$j = -D \frac{dn}{dx} \qquad \text{EQ. 1}$$

or in particular, $$j = -D \frac{\Delta n}{h} = -D \frac{(n - n_o)}{h} = -D \frac{\alpha(p - p_o)}{h} \qquad \text{EQ. 2}$$

wherein j is density of gas flow; h is thickness $t_h$ of unpatterned substrate layer 66; D is the diffusion coefficient; n is the concentration of gases 60 within the polymerizable material 34; $n_o$ is the concentration of gases 60 at atmospheric pressure; and a is the proportionality coefficient between gas concentration and gas pressure. As such, by adjusting feature thickness 24 and 26 of patterned substrate layer 66, the permeability of gases 60 may be altered. For example, thickness $t_h$ of patterned substrate layer 66 may be between about 100 and about 150 nm. In an example, if the thickness of features 24 and 26 is about 80 nm, then the remaining thickness of patterned substrate layer 60 may be about 20 to about 70 nm, and that thickness may limit the gas permeability.

Figure 12:
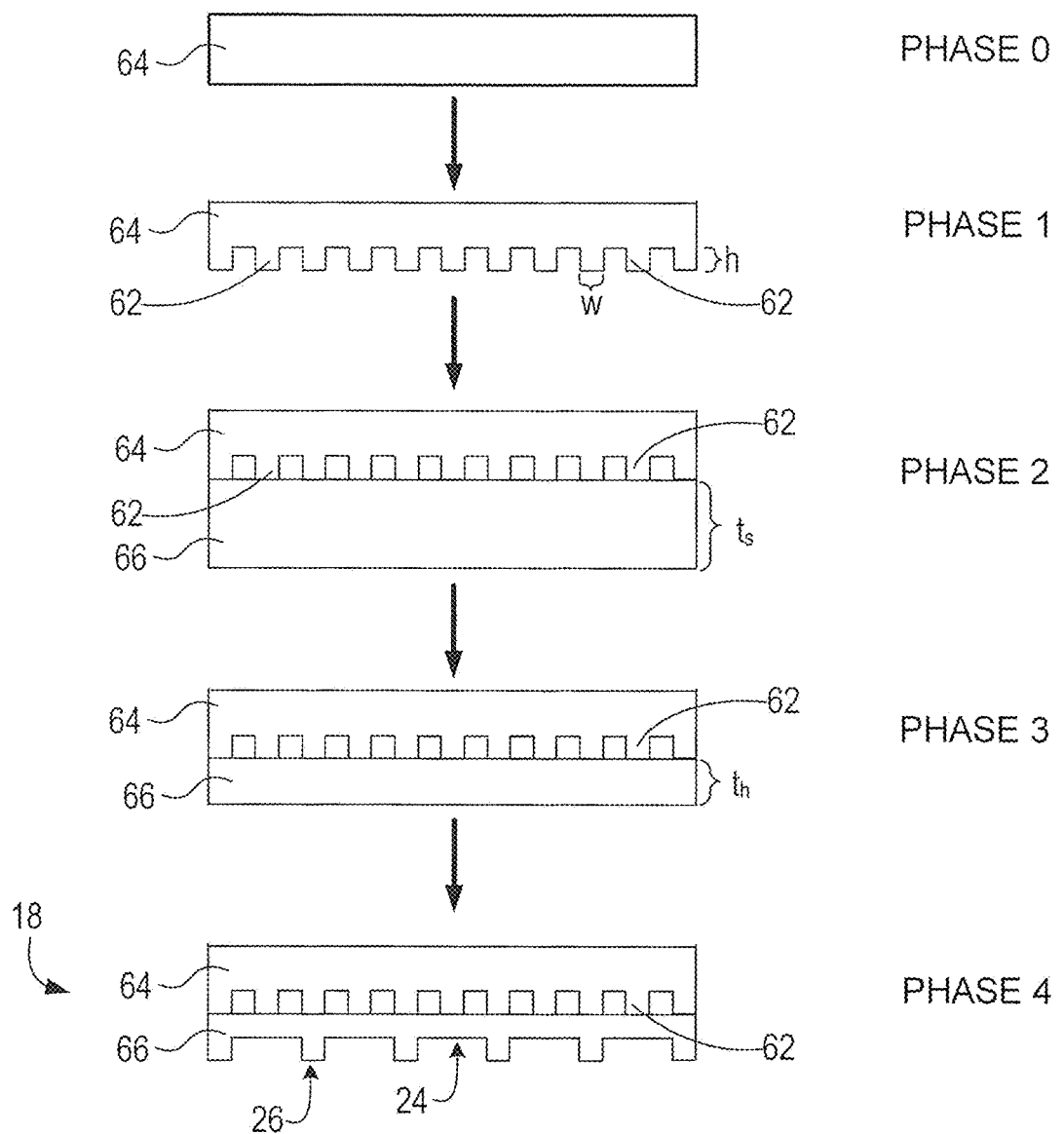
FIG. 12 illustrates simplified side views of a template formation.
Figure 13:
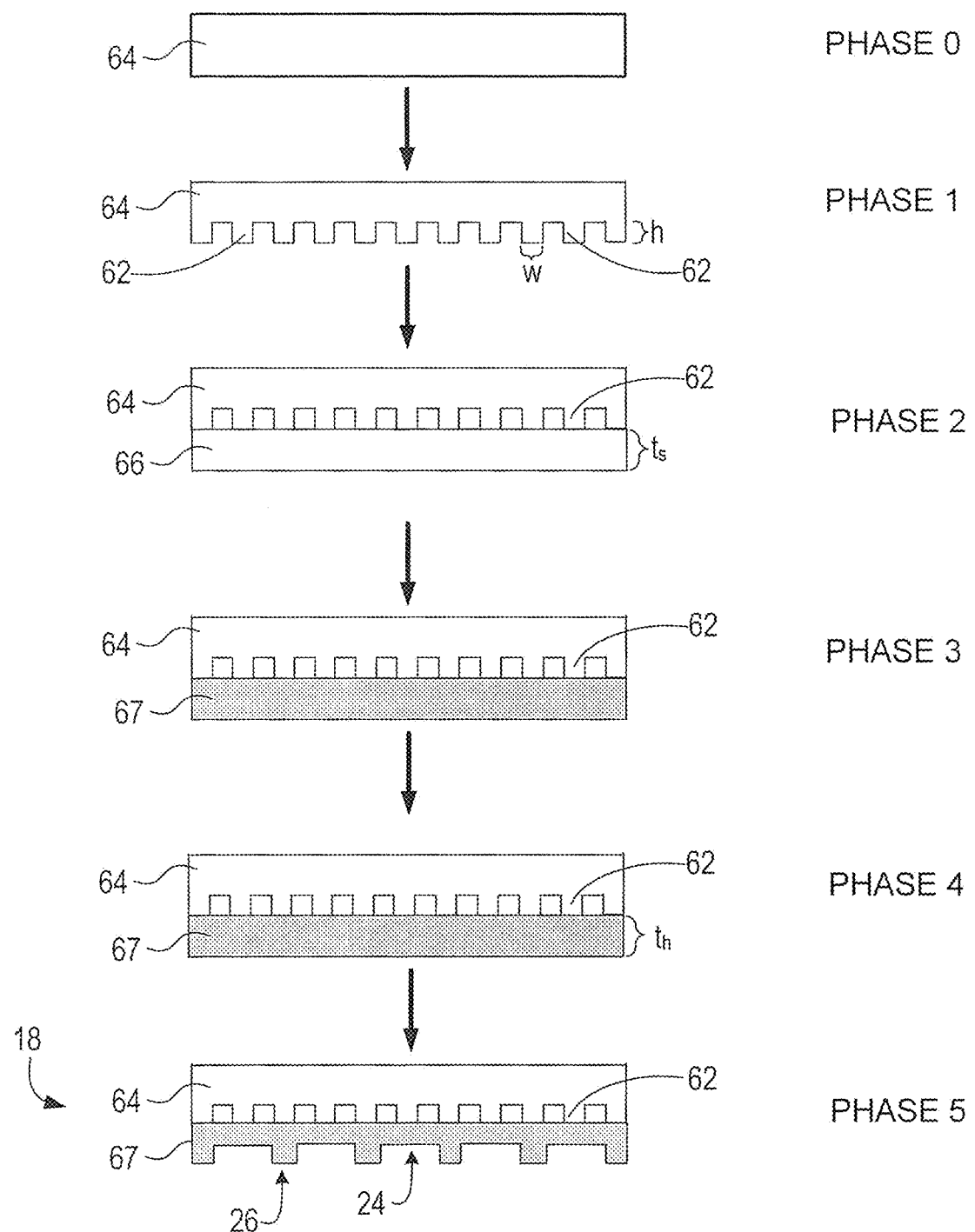
FIG. 13 illustrates simplified side views of a template formation.

FIGS. 12 and 13 illustrate simplified side views of template formations. As illustrated in FIG. 12 template 18 may include substrate layer 64 (Phase 0). Substrate layer 64 may be formed from materials including, but not limited to quartz, silicon, organic polymers, siloxane polymers, borosilicate glass, fluorocarbon polymers, metal, hardened sapphire, and/or the like. During lithography Phase 1, substrate layer 64 may be patterned, to provide posts 62. For example, posts 62 may be formed having a width w of about 10 nm to about 1 μm, and a height h of about 10 nm to about 300 nm. Density of posts 62 may be in a range of about 30% to about 70%. Alternatively, posts 62 may be formed on substrate layer 64. Patterned substrate layer 66, having a thickness $t_s$ may be bonded to posts 62 by a bonding technique (e.g., glass bonding) in Phase 2. For example, patterned substrate layer 66, formed of glass material, may be bonded to posts 62, also formed of glass material. Patterned substrate layer 66, having thickness $t_s$, 66 may be thinned, polished, and/or planarized to thickness $t_h$ (Phase 3). Thickness $t_h$ is May be selected for usability. It should be noted that Phase 3 may be optional if patterned substrate layer 66 thickness $t_s$ is substantially formed to thickness $t_h$ without the need for thinning polishing and/or planarization. During lithography Phase 4, patterned substrate layer 66 may be patterned with features 24 and 26.

FIG. 13 illustrates simplified side views of an exemplary template formation. As illustrated in FIG. 13, template 18 may include substrate layer 64 (Phase 0). Substrate layer 64 may be formed from materials including, but not limited to quartz, silicon, organic polymers, siloxane polymers, borosilicate glass, fluorocarbon polymers, metal, hardened sapphire, and/or the like. During lithography Phase 1, substrate layer 64 may be patterned to provide posts 62. For example, posts 62 may be formed having a width w of about 10 nm to about 1 μm, and a height h of about 10 nm to about 300 nm. Density of posts 62 may be between about 30% and about 70%. Alternatively, posts 62 may be formed on substrate layer 64. Patterned substrate layer 66, having a thickness $t_s$, may be bonded to posts 62 by a bonding technique (e.g., glass to Si bonding) in Phase 2. For example, patterned substrate layer 66, formed of silicon material, may be bonded to posts 62 formed of glass material. In this example, patterned substrate layer 66 thickness $t_s$ may be substantially similar to $t_h$, wherein $t_h$ is a pre-determined thickness for usability. As such, patterned substrate layer 66 may be further oxidized to form oxidized patterned substrate layer 67 (Phase 3). Oxidized patterned substrate layer 67, having thickness $t_s$, may be thinned, polished, and/or planarized to thickness $t_h$ (Phase 4) as needed. During lithography Phase 5, oxidized patterned substrate layer 67 may be patterned with features 24 and 26.

Figure 14:
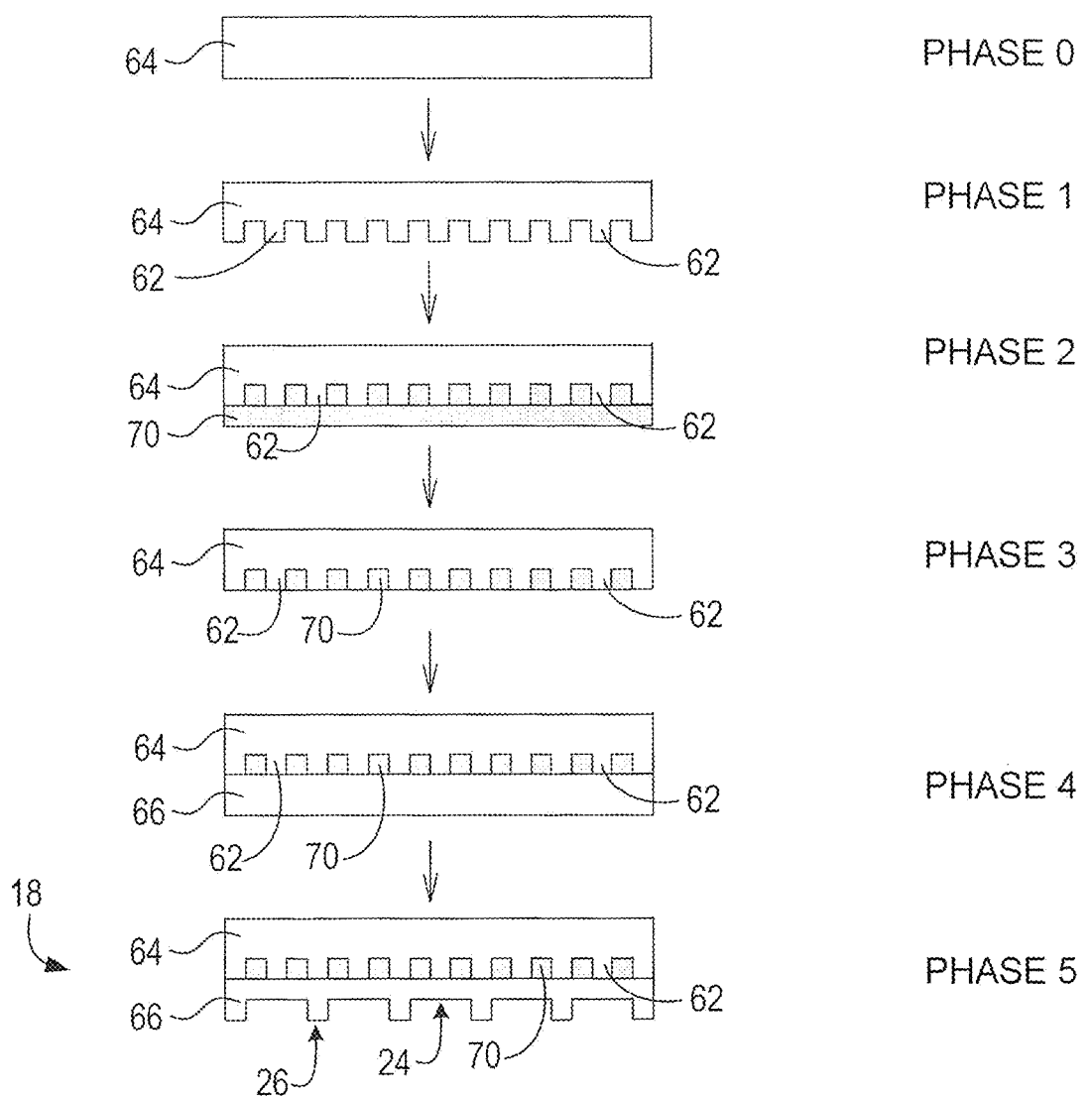
FIG. 14 illustrates simplified side views of a template formation with filling material.
Figure 15:
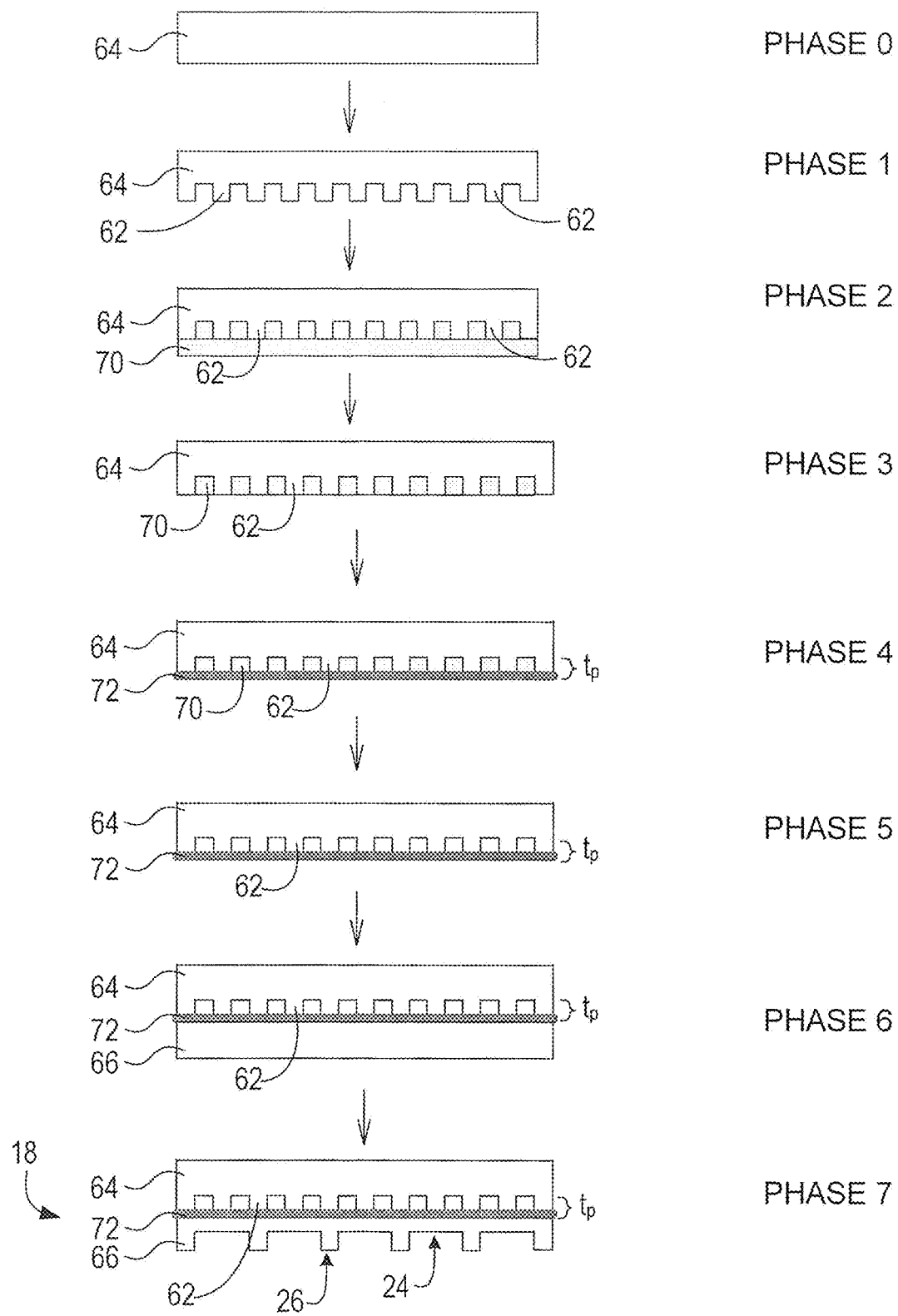
FIG. 15 illustrates simplified side views of a template formation using filling material, wherein filling material may be removed prior to patterning of a patterned substrate layer.

In some embodiments, as illustrated in FIGS. 14 and 15, filling material 70 may be deposited between posts 62 during template formation. Filling material 70 may be formed of materials including, but not limited to, porous low-k materials, porous organic materials, in-situ foaming materials, and/or the like. In some cases, filling material 70 may be formed of materials considered stable during imprint processing conditions. For example, filling material 70 may be considered thermally stable up to at least about 100° C., at least about 150° C., at least about 250° C., or above. Filling material 70 may be formed of porous media and/or shrinkable material to provide for high porosity. For example, porosity may be at least 20%. Alternatively, porosity may be at least 80%. Additionally, filling material may have a shrink ratio of at least about 20%. Alternatively, shrink ratio may be at least about 80%. One example of a suitable filling material 70 is a porous low-k material that may be spin on glass (SOG) with one or more porogens, such as polyethylene oxide (PEO) or surfactants. For example, Tetronic®, a tetra-functional block copolymer based on ethylene oxide and propylene oxide from BASF (Ludwigshafen, Germany), may be used as filling material 70.

FIG. 14 illustrates simplified side views of exemplary template 18 formation using filling material 70. In some cases, template 18 includes substrate layer 64 (Phase 0). During lithography Phase 1, substrate layer 64 may be patterned to provide posts 62. Filling material 70 may be deposited onto substrate layer 64 as shown in Phase 2 (e.g., spin-on process). An, etch process may be used to remove excess filling material 70 and expose posts 62 (Phase 3). Patterned substrate layer 66 may be deposited on posts 62 and filling material 70 (Phase 4). For example, patterned substrate layer 66 may be deposited on posts 62 and filling material 70 using a CVD process. During lithography Phase 5, patterned substrate layer 66 may be patterned with features 24 and 26 (Phase 5).

FIG. 15 illustrates simplified side views of exemplary template 18 formation using filling material 70, wherein filling material 70 may be removed prior to patterning of patterned substrate layer 66. In some cases, template 18 includes substrate layer 64 (Phase 0). During lithography Phase 1, substrate layer 64 may be patterned to provide posts 62. Filling material 70 may be deposited onto substrate layer 64 as shown in Phase 2 (e.g., spin-on process). Filling material 70 may be degradable under thermal, UV, or similar conditions. For example, filling material 70 may be polyethylene oxide (PEO), which may be applied using spin-on process and may be readily decomposed when heated above 250° C. An etch process may be used to remove excess filling material 70 and expose posts 62 (Phase 3). A porous layer 72 may be deposited on posts 62 and filling material 70 (e.g., spin-on process, CVD, or the like).

Porous layer 72 may be formed of materials including, but not limited to porous low-k material, porous organic material, and/or the like. Porous layer 72 materials may be stable under conditions used to decompose filling material 70. Additionally, porous layer 72 may adhere favorably to posts 62 and patterned substrate layer 66. Thickness $t_p$ of porous layer 72 may be provided such that internal stress of porous layer 72 is minimized. For example, a thickness $t_p$ of porous layer 72 may be in a range from less than 10 nm to about 100 mm.

Filling material 70 may be removed by decomposition to gas phase and channeled through the porous layer 72 (Phase 5). Patterned substrate layer 66 may be deposited on porous layer 72 (Phase 6). For example, patterned substrate layer 66 may be deposited on porous layer 72 using CVD process. During lithography Phase 7, patterned substrate layer 66 may be patterned with features 24 and 26 (Phase 5).

Figure 16A:
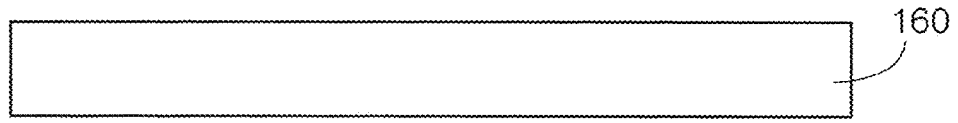
FIGS. 16A-E illustrate steps in a process to form a porous template.
Figure 16B:
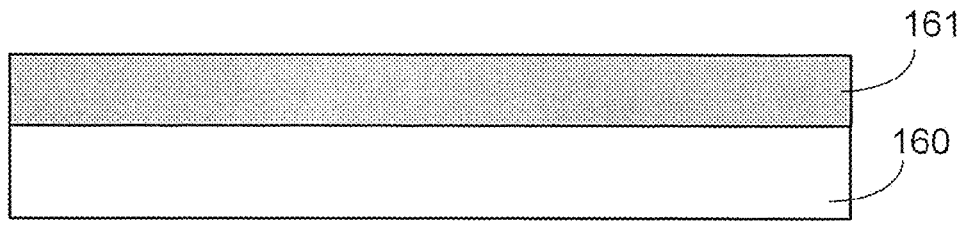
Figure 16C:
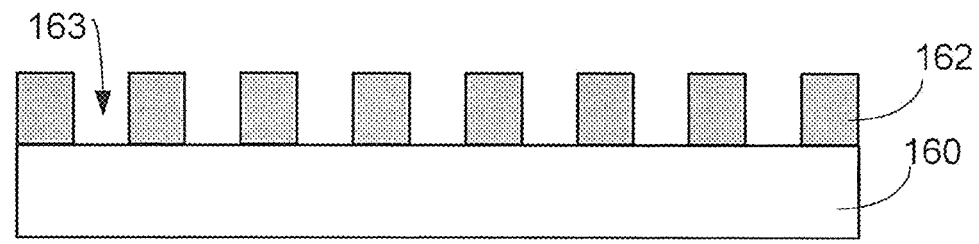
Figure 16D:
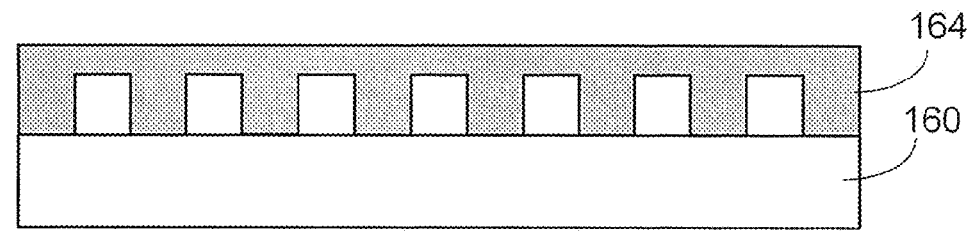
Figure 16E:
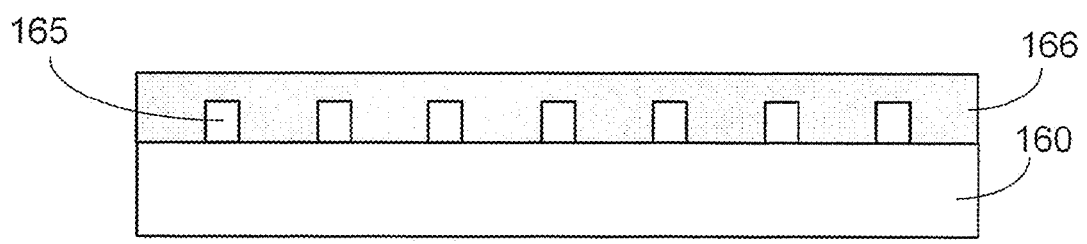

In some embodiments, pores or channels may be formed underneath trenches or recesses in a nano-imprint lithography template, such that trapped gases diffuse into the pores. FIGS. 16A-E illustrate steps in a process to form channels in a template. FIG. 16A illustrates a side view of a substrate (e.g., a fused silica substrate). As shown in FIG. 16B, a layer of silicon 161 may be deposited (e.g., by PECVD) on template 160. The silicon layer may be patterned through nano-imprinting lithography to form protrusions 162, with recesses 163 extending to the template 160, as shown in FIG. 16C. FIG. 16D shows silicon layer 164 after the silicon has been liquefied by nanosecond laser pulse irradiation, and the molten silicon from each protrusion has filled in the openings above recesses 163 to form channels 165. The silicon layer 164 may be oxidized through, for example, thermal oxidation, to form silicon oxide ($SiO_2$) layer 166, as shown in FIG. 16E. Further processing, including polishing, feature fabrication, and the like, may be performed on the porous template shown in FIG. 16E.

For the porous template formed as shown in FIGS. 16A-E, the size, shape and gas capacity of the channels may be, controlled by the original silicon pattern, the power and elapse time of the laser pulse, and the conditions of oxidation. In addition, the thermal oxidation allows a slow annealing, yielding substantially defect-free (e.g., crack-free) templates. When template 160 is fused silica, the silicon oxide layer 166 and the substrate have substantially the same thermal expansion coefficient, thus contributing to the formation of defect-free templates. $SiO_2$ templates fabricated by the process shown in FIGS. 16A-E may have greater mechanical strength that templates including low-k porous material. With, for example, about 50% porosity proximate the channel area, the mechanical strength of the template may be about 40 GPa, or about four times the mechanical strength of porous low-k materials, known to have a mechanical strength of less than about 10 GPa.

Xia et al., "Sub-10 nm Self-Enclosed Self-Limited Nanofluidic Channel Arrays," *Nano Lett.* 2008, 8(11), 3830-3833, which is incorporated by reference herein, describes changes in silicon nanostructure that occur during, laser heating, including channel formation and influence of laser fluencies on channel height.

In some embodiments, recesses or trench-like structures may be formed in a template to provide an evacuation path for gases trapped between a template and a substrate during an imprinting process, thereby increasing filling speed and throughput. FIGS. 17A-G illustrate steps in a process to form a porous template.

Figure 17A:
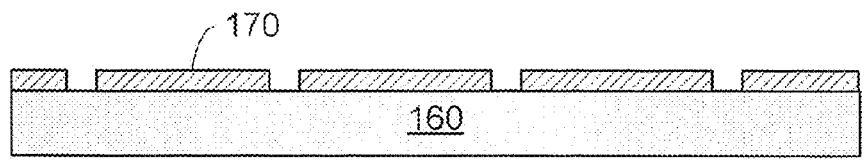
FIGS. 17A-G illustrate steps in a process to form a porous template.
Figure 17B:
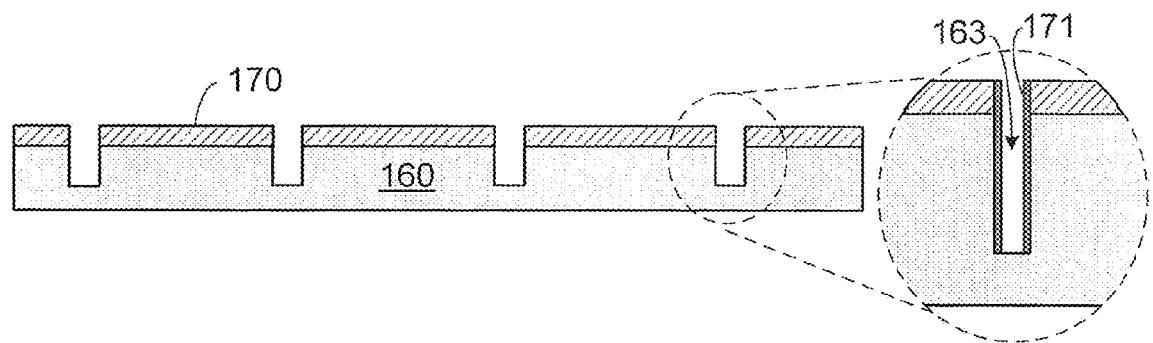
Figure 17C:
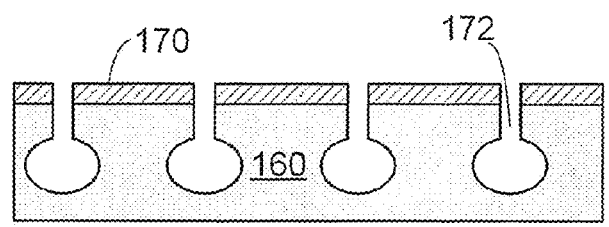
Figure 17D:
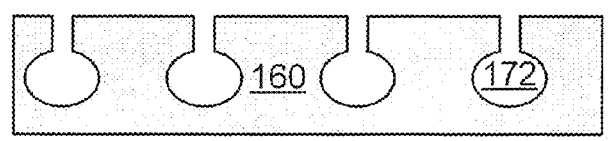

In FIG. 17A, a patterned mask 170 is prepared on a fused silica template 160. In an example, the mask periodicity substantially replicates that required in the final template. In FIG. 17B shows the template after a standard isotropic oxide etch with, for example, a $CF_x$ plasma. In some cases, a protective polymer coating 171 may be applied to side walls of recesses 163, as shown in the enlarged portion of FIG. 17B. The bottom of the recess 163 may remain uncoated. An isotropic etch (e.g., HF based) may be optionally carried out to open up a bottom of the recesses 163 to form openings 172, as shown in FIG. 17C. In some cases, a depth of recesses 163 may be increased instead of, or together with, forming openings 172 as depicted in FIG. 17C. After etching, the template may be stripped and cleaned to remove, for example, the patterned mask and the polymer coating on the side walls of recesses 163. A stripped, cleaned template is shown in FIG. 17D.

Figure 17E:
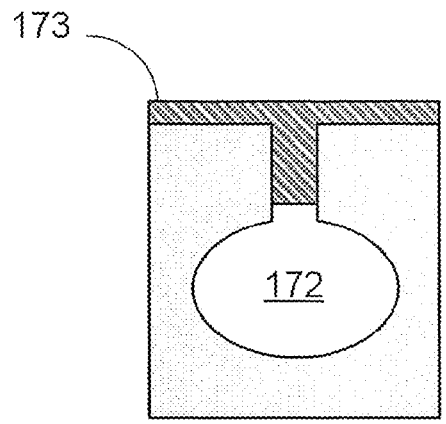
Figure 17F:
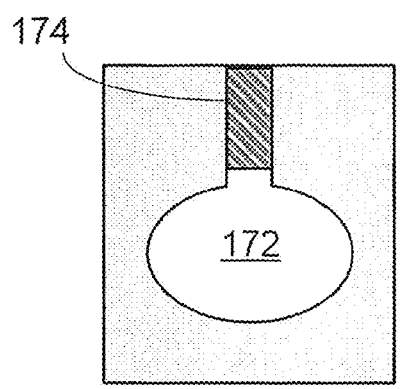
Figure 17G:
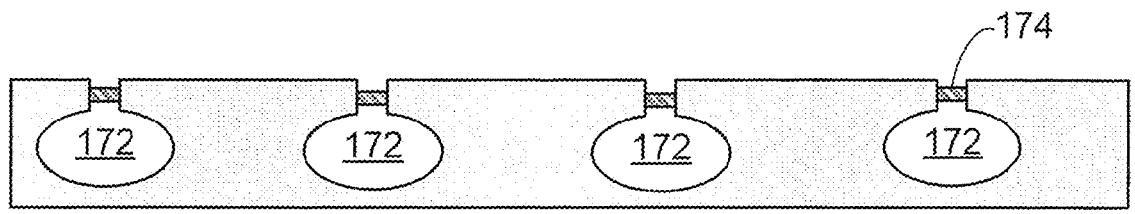

In some embodiments, openings 172 may be formed with substantially the same periodicity and size as the final mask. This may be achieved by a process including depositing a conformal oxide layer 173 to plug the opening of the recess 163, as shown in FIG. 17E. As shown in FIG. 17F, the top of the conformal oxide above may be stripped, leaving a conformal oxide plug 174 in the recess 163. As shown in FIG. 17G, conformal plugs 174 may be further stripped back to a dimension corresponding to a desired template recess depth. The mechanical load experienced during imprinting may be borne by the fused silica portion of the template, with the conformal oxide plugs serving to act as a semi-permeable filter for helium and as a seal for liquids. In some cases, HARP™ (high aspect ratio process) CVD oxide (Applied Materials) may be used to deposit conformal oxide.

Figure 18A:
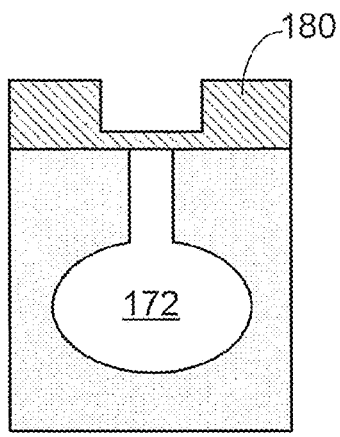
FIGS. 18A-D illustrate portions of various porous templates formed by two-step patterning.
Figure 18B:
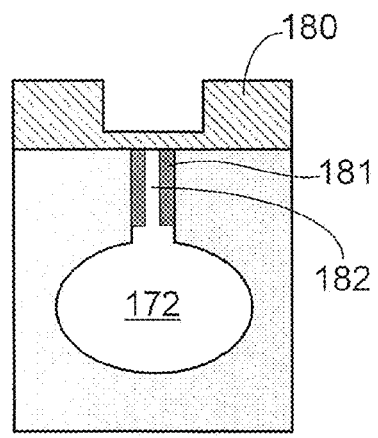
Figure 18C:
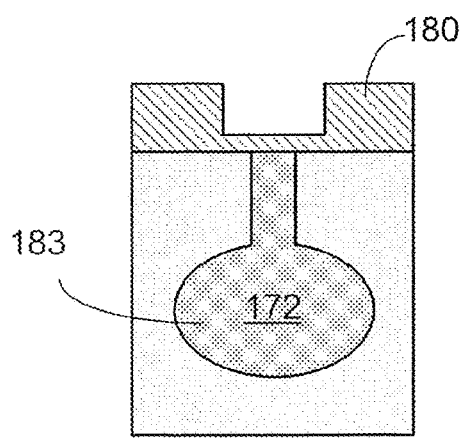
Figure 18D:
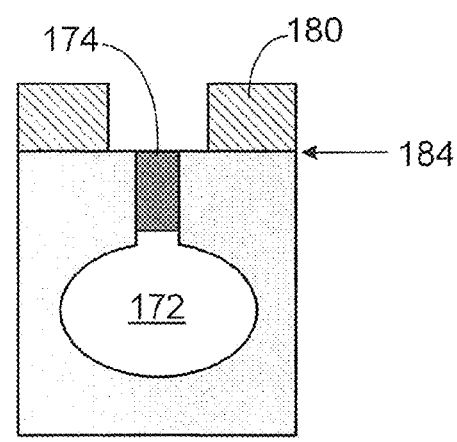

FIGS. 18A-D illustrate examples, of two-step (recess and imprint template) patterning. In this process, recess patterning is decoupled from imprint patterning in a simplified process that is independent of the feature sizes on the template. Furthermore, openings are not required to be in a specific location with respect to the template. In one embodiment, as illustrated in FIG. 18A, a robust cap oxide 180 is deposited (e.g., by HDP, PECVD) on top of a patterned fused silica template 160 with openings 172. In FIG. 18B, recess opening 181 may be partially sealed with a conformal oxide 182 to provide additional mechanical support for the cap oxide 180 before the cap oxide is applied to the template. In some cases, as shown in FIG. 18C, a porous oxide material 183, such as that derived from SOG, may be placed in the recess to provide mechanical support for cap oxide 180. If the cap oxide 180 is found to be impermeable, it may be possible to eliminate or significantly reduce a thickness of the cap film at the base of the diffusion junction 184. FIG. 18D illustrates a sealed conformal oxide plug with a fully recessed cap oxide 180 and plug 174. U.S. Pat. No. 7,314,792, which is incorporated by reference herein, describes recessed array transistors and spherical recessed array transistor trench structures used for memory devices for creating large volume recesses using isotropic etches.

Protective Layers for Mesa Formation in Imprint Lithography

In optical lithography processes, adhesion promoters which bind a photoresist to a metal oxide surface are neither designed nor required to manage a second force in direct competition with the adhesion of the resist to the substrate as in an imprint lithography process. As such, chemical bonding between the adhesion promoter and an imprint resist, and the cohesive strength of the adhesion material may be improved for an imprint lithography process.

To inhibit material from sticking to the template, a polymeric adhesion layer may be designed to form covalent bonds with both the acrylate imprint resist on top and the underlying metal oxide surface. The polymeric adhesion layer may be cross-linked to increase the cohesive strength and reduce failure under tensile load during the imprint lithography process.

A polymeric adhesion layer and transfer layer are described in United States Patent Application Publication Nos. 2007/00176311 and 2007/0021520, both of which are incorporated herein by reference. The adhesion layer is a tie-layer between the substrate and the imprint. The polymeric adhesion layer may be formed through a spin coating process and cured by a UV or thermal process. It is an organic material that may be easily wetted by the acrylate imprint resist. The adhesion layer promotes retention of the cured imprint on the wafer side upon separation of the template from the imprint.

The polymeric adhesion layer may include polymeric molecules with 8-11 repeating units, a cross-linker, and catalyst. These components may be dissolved in a suitable solvent such as PGMEA for spin coating. The polymeric adhesion layer solvent mixture may be cast onto a wafer and forms a film during the spinning process. A majority of the solvent May evaporate during the spinning process, leaving behind a thin film of solids on the surface. The percentage of dissolved solids in the solvent and the spin coating speed are adjusted to achieve the desired final film thickness on the wafer. A thermal or UV curing step crosslinks the oligomer and generates reaction sites which are able to form strong chemical bonds with the metal oxide substrate and acrylate monomer In some embodiments, using a spin coating technique, a polymeric adhesion layer with a thickness of 1 nm is achieved, although the length of the starting molecules used in the polymeric adhesion layer substantially exceed 1 nm.

There is a growing demand for thickness reduction of the imprint stack underneath the imprinted features. This imprint stack includes a transfer layer and an imprint residual layer. The transfer layer may also be referred to as the adhesion layer. Current imprinting processes are able to generate a 20 nm thick residual layer with very tight control. Therefore, it may be desirable to make the adhesion layer much thinner than 20 nm so that the thickness of the adhesion layer minimally influences the overall thickness of the stack.

Traditionally, to achieve a 1 nm or so ultra-thin adhesion layer, a small adhesion promoter, or coupling agent, molecule is used. The coupling agent may be vapor treated or spun coated onto the substrates. One concern of this approach is that the adhesion layer developed via these types of coupling, agent molecules is mechanically not very strong. Therefore the adhesion could be limited by the tear out strength of the adhesion layer.

As disclosed in the United States patent application publications 2007/00176311 and 2007/0021520, adhesion improvement may be achieved by forming covalent chemical bonds with substrates, and by making the adhesion layer mechanically strong. Two factors affecting the mechanical strength of the adhesion layer are the molecular weight (MW) of the starting molecules and the backbone structure of the starting molecules. High starting MW may provide better mechanical strength.

The detailed composition of the polymeric adhesion layer can be found, in United States patent application publications 2007/00176311 and 2007/0021520. The chemical structure of, IsoRad 501, a component used in the polymeric adhesion layer formulation, is shown below.

Structure A

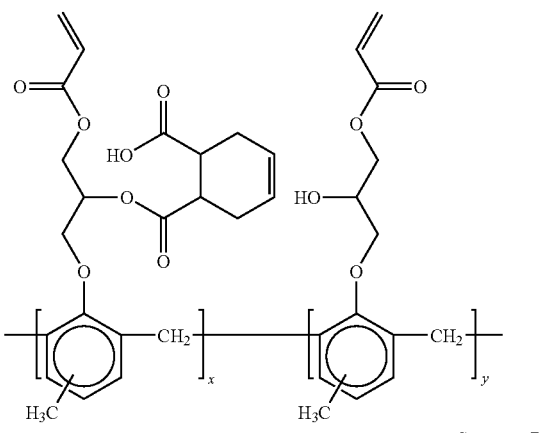

Structure B

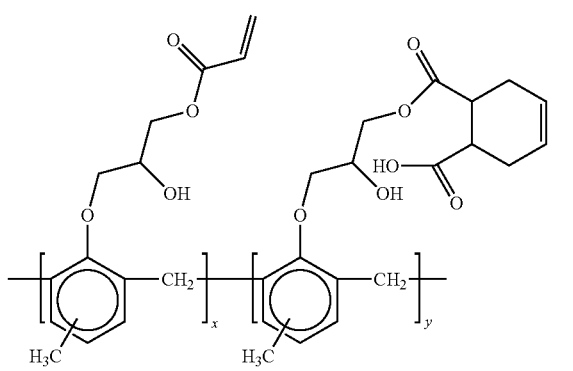

Depending on synthesis procedures, IsoRad 501 could have structure A, B, or something similar. x and y are designated as the repeating numbers. Both A and B are made from a cresol epoxy novalac as shown below. The repeating number n ranges from 8 to 11, and x+y=n. Therefore the molecular weights of A and B may range from about 2,000 to 4,000 Dalton. The high molecular weight contributes to the mechanical strength build up of the adhesion layer. Using a standard covalent bond length as the reference, the lengths of the polymeric backbones of the structure A and B are in the range of 2 to 4 nm if extended linearly. Hence polymeric structures such as A and B normally are not used as the starting materials to make a 1 nm ultra-thin adhesion layer.

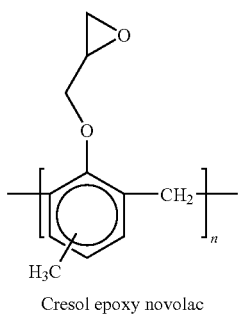

Cresol epoxy novolac

To that end, using spin coating, an adhesion layer with 1 nm thickness was cast and cured. High molecular weight molecules or those with a bulky configuration could result in coiling, entanglement, or rotations; therefore, in order to achieve 1 nm thickness, molecules A and B may be laid substantially flat against the coating substrate. These types of configurations were achieved through spin casting.

The present adhesion layer (Example 1) is 0.05% solid. PM Acetate (PGMEA) is used as the cast solvent. These components are described in United States Patent Application Publication Nos. 2007/00176311 and 2007/0021520.

Example 1

| Component | Amount (g) |
|---|---|
| IsoRad 501 | 0.81 |
| Cymel 303 ULF | 0.18 |
| Cycat 4040 | 0.01 |
| PM Acetate | 1999 |

All components are listed in grams

The polymeric adhesion layer solvent mixture is cast onto a wafer and forms a film during the spin process. The spinning process evaporates a majority of the solvent, leaving behind a thin film of solids on the surface. The percentage of dissolved solids in the solvent and the spin coating speed are adjusted to achieve the desired final film thickness on the wafer. With the present polymeric adhesion layer, 1000 rpm spin rate was used to achieve the 1 nm thickness. The adhesion layer was spun coated onto a silicon wafer, and was contact baked on a hot plate at 150° C. for 1 minute to achieve desirable curing. Optical measurement using a Metrosol system (Metrosol, Austin, Tex.) was carried out for solid film thickness measurement. Film thickness is substantially uniform across an 8" wafer as shown in FIGS. 19A and 19B. The dots indicate measurement locations with two different Metrosol systems. In FIG. 19A, there were 59 measurement locations, with a mean thickness of 1.09 nm, □=0.05 nm, a maximum thickness of 1.22 nm, and a minimum thickness of 0.94 nm. In FIG. 19B, there were 49 measurement locations, with a mean thickness of 1.01 nm, □=0.03 nm, a maximum thickness of 1.07 nm, and a minimum thickness of 0.95 nm.

FIG. 20 is an SEM tilt image of the adhesion layer 200 shown in FIGS. 19A and B on substrate 202. FIG. 20 indicates uniformity of the adhesion layer.

The 1 nm thick film performs similarly to thicker (>6 nm) polymeric adhesion layers. In order to retain the adhesion properties, the 1 nm polymeric adhesion layer film is able to chemically bond with the metal oxide surface on the bottom, and to the acrylate imprint resist on top. Internal strength of the film is maintained as the material does not exhibit cohesive failure under tensile load applied during template separation.

The polymeric adhesion layer described herein may be used in nano-imprint lithography processes including, for example, the formation of imprint masks in the fabrication of a pedestal or mesa. In the conventional process flow used to create the imprint masks (or templates), the mesa is formed after the high resolution features are lithographed and etched into the imprint mask substrate. The mesa may be formed by masking the imprint mask active area with a positive I-line optical photoresist, and then etching the substrate with, for example, a 6:1 aqueous buffered oxide etchant. The non-mesa area may be etched to a depth of 15 μm. In some cases, the adhesion of the photoresist to the imprint mask substrate (made, for example, from UV-fused silica), is insufficient to withstand the wet etch. In some cases, a chromium mask is left intact on the surface of the mesa (or active area), at least around the perimeter that will be exposed to the isotropic undercut from the wet etch. If the chromium is not left in place, an uncontrolled lateral undercutting and lifting of the resists occurs which results in destruction of the features and loss of fidelity of the mesa edge. Mesa edge fidelity is important for fluid control during imprinting.

To enhance the resolution of the imprint mask manufacturing process, thinner chromium films may be used as a charge depletion and hard mask layer. Consequently, there may not be sufficient chromium left over following the oxide etch relief to protect the mesa during the mesa etch. An additional blanket layer of chromium may be added for protection, resulting in better adhesion, but also resulting in chromium deposition in the fine features of the imprint mask. This chromium may be removed with high efficacy for optimal functioning of the imprint mask. Removal of the chromium may be hindered by poor material transport in the small features. In some cases, the chromium may intermix with the upper atomic layers of the oxide and effectively change the stoichiometry of the imprint mask. More aggressive removal/cleaning of the chromium layer, including ultrasonic cleaning, may damage the fine features of the imprint mask and erode the critical dimensions (CDs) of the features.

FIGS. 21A-C illustrate process flows used to manufacture mesas for nano-imprint lithography imprint masks. In some embodiments, as illustrated in FIG. 21B, an adhesion layer as described herein (e.g., Example 1 or other organic or inorganic compositions that are easy to apply and provide good adhesion without intermixing with fused silica or other substrate material), may be used to, promote adhesion of a resist during mesa formation. The adhesion layer may be applied through spin coating, evaporation, sputter deposition, ion beam deposition, and the like. In other embodiments, as illustrated in FIG. 21C, with the exception of a perimeter (e.g., the outer 20 μm), the entire active area may be masked prior to chromium deposition, so that the chromium for adhesion of the resist it only at the very edges of the mesa field. In the embodiments illustrated in FIGS. 21B and 21C, the process is designed to allow the mesa features to withstand an aggressive wet etch, while preserving the stoichiometry of the fused silica surface. In the examples illustrated in FIGS. 21B and 21C, the high aspect ratio, fine critical features are protected by an organic film, instead of an inorganic metal film (e.g., chromium). The organic material deposited in the features in FIGS. 21B and 21C may be removed with cleaning techniques available in the industry to remove and clean organic films with high efficacy and high selectivity to the fused silica features.

In FIG. 21A(1a), starting 6025 UV fused silica photo mask blank is prepared with chromium and resist for E-beam lithography. In the case of imprint masks, both the chromium and resist films may be thinner than conventional films used for optical lithography. The chromium thickness may be 10 nm or less.

In FIG. 21A(1b), the line patterns are formed on substrate, using E-beam lithography, develop, and chromium etch.

In FIG. 21A(1c), the pattern is transferred in the fused silica via a reactive ion etch (RIE), or inductively couple plasma (ICP) using the chromium film as a hard mask. During this step, some amount of the chromium hard mask is consumed during the etch. As manufacturers have migrated to thinner films, the chromium loss becomes significant such that enough chromium is not left intact to promote resist adhesion in the subsequent wet etch.

In FIG. 21A(1d), following cleaning and stripping; a fresh chromium film is deposited over the entire surface of the mask substrate including the fine features. The chromium film may be applied by evaporation or sputter deposition.

In FIG. 21A(1e), the active or mesa area is masked. This may be done with an I-line resist lithography system. The chromium is etched in the "off-mesa" region and the exposed fused silica is subjected to an aqueous buffered oxide etch to form the mesa.

In FIG. 21A(1f), the photoresist and the chromium resist are removed from the mesa. The resist is removed with conventional Sulfuric Peroxide Mixtures (SPM) or oxygen plasmas. The chromium is removed by an aqueous perchloric acid/Ceric Ammonium Nitrate mix, or via a selective dry etch.

FIG. 21B illustrates an etching process including protecting the features of an imprint mask with an adhesion layer. Steps 2a, 2b, and 2c are similar to Steps 1a, 1b, and 1c, respectively, in FIG. 21A.

In FIG. 21B(2d), an adhesion layer is applied to the substrate. The adhesion layer composition may be applied, for example, via spin coating, vapor deposition, or the like.

In FIG. 21B(2e), the mesa pattern may be defined via optical lithography, imprint lithography, or the like, using an appropriately sized "mesa-only" imprint mask. Care may be taken to avoid stray or scattered exposure light to unintentionally expose the mesa region. A dry etch or descum etch may be implemented to remove the adhesion layer in the off-mesa region. Consequently, the photoresist or imprint resist used to protect the mesa may be chosen to be of the appropriate thickness to substantially avoid the risk of erosion of features in the imprint mask. A chromium etch may be performed at this point to clear residue in the off-mesa region. The exposed fused silica may be subjected to an aqueous buffered oxide etch.

In FIG. 21B(2f), the resist used to form the mesa, the adhesion layer, and the chromium in the active area are removed. Since chromium was never deposited into the fine critical features, conventional cleans are adequate to remove unwanted films without critical dimension loss.

FIG. 21C illustrates another method of fabricating an imprint mask without depositing chromium in the critical features. As with the process depicted in FIG. 21B, conventional cleans may be used. The method illustrated in FIG. 21C uses chromium to promote adhesion in the outer perimeter of the active area (i.e., the scribeline area). Since the pedestal etch process is a wet etch, it is isotropic. Therefore, an undercut of 15 μm may be experienced for a 15 μm deep mesa. This undercut may be accounted for in the design of pattern used to define the mesa, so that written mesa pattern may be oversized by at least 15 μm. Only a few microns of chromium may be needed around the perimeter to secure adhesion of the resist to the fused silica substrate during buffered oxide etch, since failure may occur at the resist-oxide interface. With a stable and well controlled buffered oxide etch process, the undercut may be predicted and a 5 μm border, plus the 15 μm for undercut, may provide sufficient protection.

In FIG. 21C, steps 3a, 3b, and 3c are similar to steps 1a, 1b, and 1c, respectively, in FIG. 21A.

In FIG. 21C(3d), the mesa is lithographed using conventional optical lithography; however the pattern may be about 20 μm per side smaller than the final mesa pattern.

In FIG. 21C(3e), with the interior of the active area and substantially all of the critical features protected, chromium is deposited over the substrate by methods such as sputter deposition, evaporation, or the like.

In FIG. 21C(3f), the mesa pattern is defined via optical lithography, or by imprint lithography, using an appropriately sized "mesa-only" imprint mask. Stray or scattered exposure light may be avoided to unintentionally expose the mesa region. A robust chromium etch may promote substantially complete removal of chromium in the non-mesa area. The exposed fused silica is subjected to an aqueous buffered oxide etch.

In FIG. 21C(3g), the films used to form the mesa are removed. The upper layer resist may be removed in SPM bath, followed by removal of the chromium and removal of the resist used to protect the critical features in the mesa.

Gaskets for Reduced Formation of Imprint Extrusions

During an imprinting process, polymeric material 34 may extrude beyond the desired volume between mold 20 and substrate 12. This may be due to the fluid pressure generated within polymeric material 34 as it is being compressed between mold 20 and substrate 12.

Figure 22:
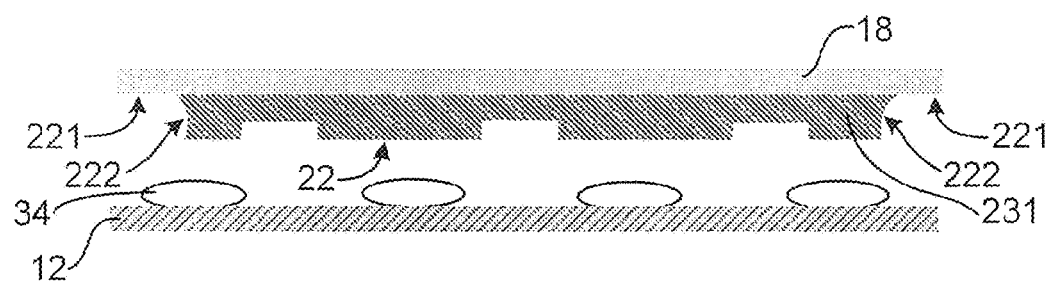
FIG. 22 illustrates a side view of the template illustrated in FIG. 1 spaced a distance away from the substrate.

Referring to FIG. 22, one attempt to confine polymeric material 34 to the desired volume includes forming mesa 220 such that it extends from a recessed surface 221 of template 18 and terminates in a plane. Sidewalls 222 may function to assist in confining polymeric material 34 within the desired volume due to the lack of capillary attraction between polymeric material 34 and mold 20 outside the volumetric gap. Fluid pressure, however, may cause a sufficient quantity of polymeric material 34 to extrude beyond the volumetric gap and, as a result, extrusions may form. Extrusions may cause defects by interfering in patterning. Additionally, after UV curing, extrusions may detach from the mold 20 and become a source of fall-on particles. Although sidewalls 222 may reduce formation of extrusions, the sidewalls may not prevent all extrusion formation. As such, other systems and methods for confining the polymeric material 34 within the desired volume and/or reducing extrusion formation may be desired.

Figure 23:
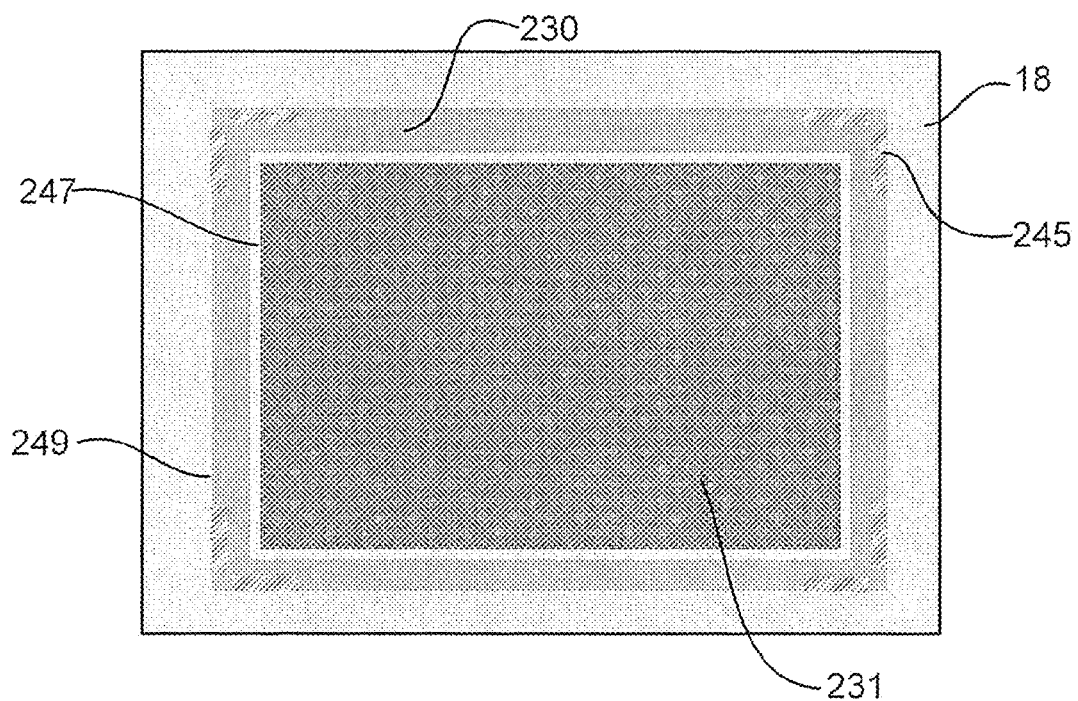
FIG. 23 illustrates a top down view of a template having a gasket formed thereon.

Referring to FIG. 23, in one embodiment, a gasket 230 may be formed on the edge of mask 231 as shown in the top down view of template 18. Gasket 230 at the edge of mask 231 forms a physical barrier and/or dam that restricts the flow of polymeric material 34 (not shown) during imprinting. Gasket 230 formation may be applied at any location at which polymeric material 34 (not shown) is undesirable. Material of gasket 230 may be selected based on design considerations (e.g., film stack of template 18). In one example, the length of gasket 230 is approximately five nm less than the thickness of residual layer t1 (shown in FIG. 2).

Figure 24:
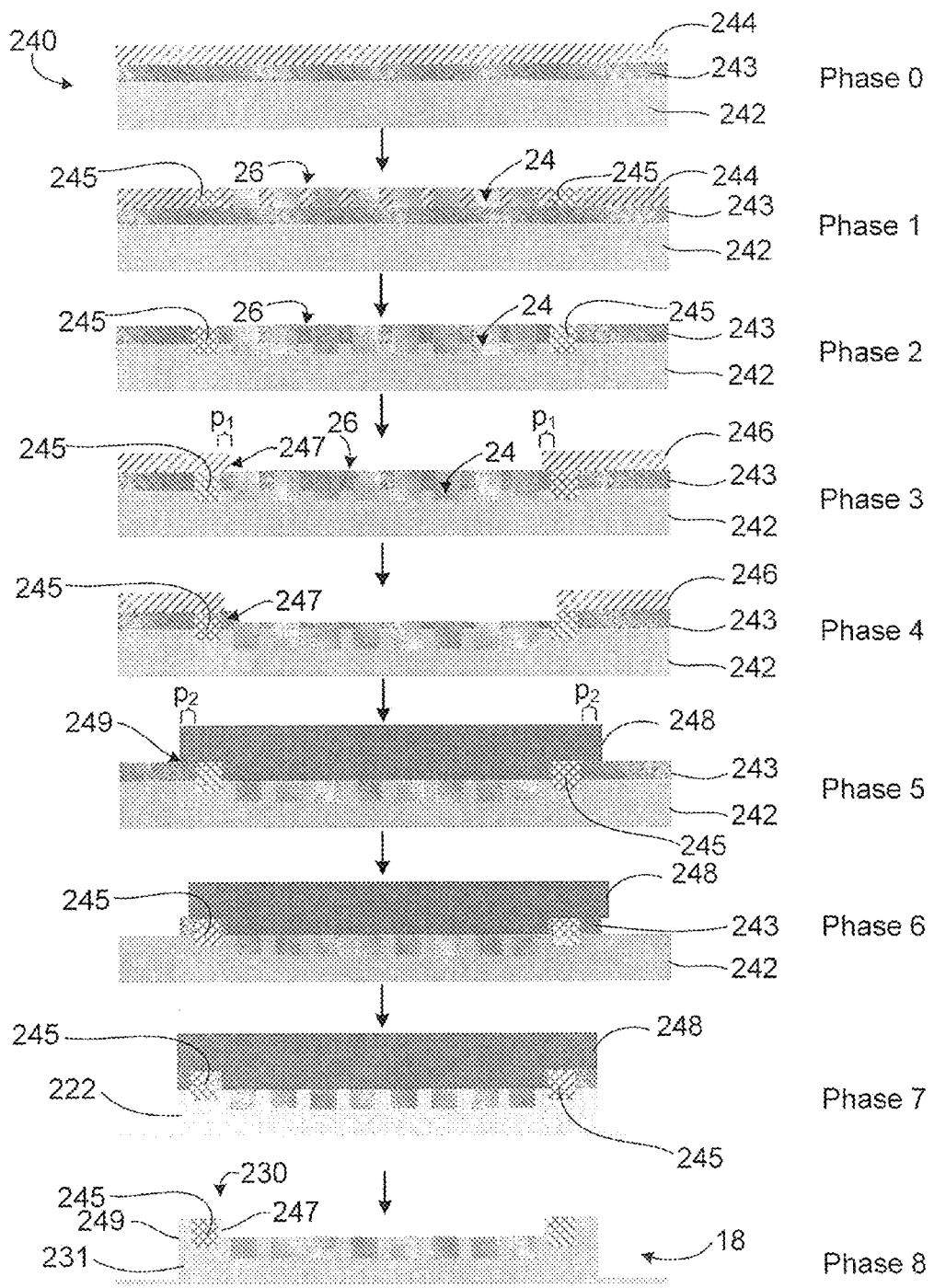
FIG. 24 illustrates simplified side, views of exemplary template formation of the template shown in FIG. 23.

FIG. 24 illustrates simplified side views of exemplary template formation of template 18 shown in FIG. 23. Template 18 may be formed from a multi-layer substrate 240, (see Phase 0). The resulting template 18 (see Phase 8) formed from multi-layer substrate 240 includes mesa 241 having gasket 230.

The multi-layer substrate 240 may include a resist 242, a hard mask layer 243 (e.g., Cr), and an oxide layer 244 (e.g., SiO2). During lithography Phase 1, oxide layer 244 may be patterned to include primary features (e.g., recessions 24 and protrusions 26) and/or alignment marks 245. Primary features 24 and 26 and/or alignment marks 245 may be further etched into hard mask layer 243 and resist 242, shown in Phase 2. During lithography Phase 3, alignment marks 245 may be substantially shielded by second resist 246. Additionally, second resist 246 may linearly extend a portion p1 from alignment marks 246 to form an inner perimeter 247 of gasket 230. With the second resist 246 substantially shielding alignment marks 245, primary features 24 and 26 are further etched into resist 242 (see Phase 4). During lithography Phase 5, alignment marks 245 may be substantially shielded by third resist 248. Additionally, third resist 248 may linearly extend a portion p2 from alignment marks 245 to form an outer perimeter 249 of gasket 230. In Phase 6 and Phase 7, sidewalls 222 of mesa 231 may be formed by methods further described in U.S. Ser. No. 11/762,278, which is herein incorporate by reference. The resulting template 18 includes mesa 231 having gasket 230 surrounding alignment marks 245.

In another embodiment (not shown), gasket 230 is formed on template 18 by build up of components of resist that may be deposited at an edge of mesa 231. In this embodiment, gasket 230 compresses and contacts substrate 12 (shown in FIG. 2) after resist has spread. This embodiment of gasket 230 may act as a damper to high frequency relative motion of template 18 with respect to substrate 12, and may enhance alignment to substrate 12.

Figure 25:
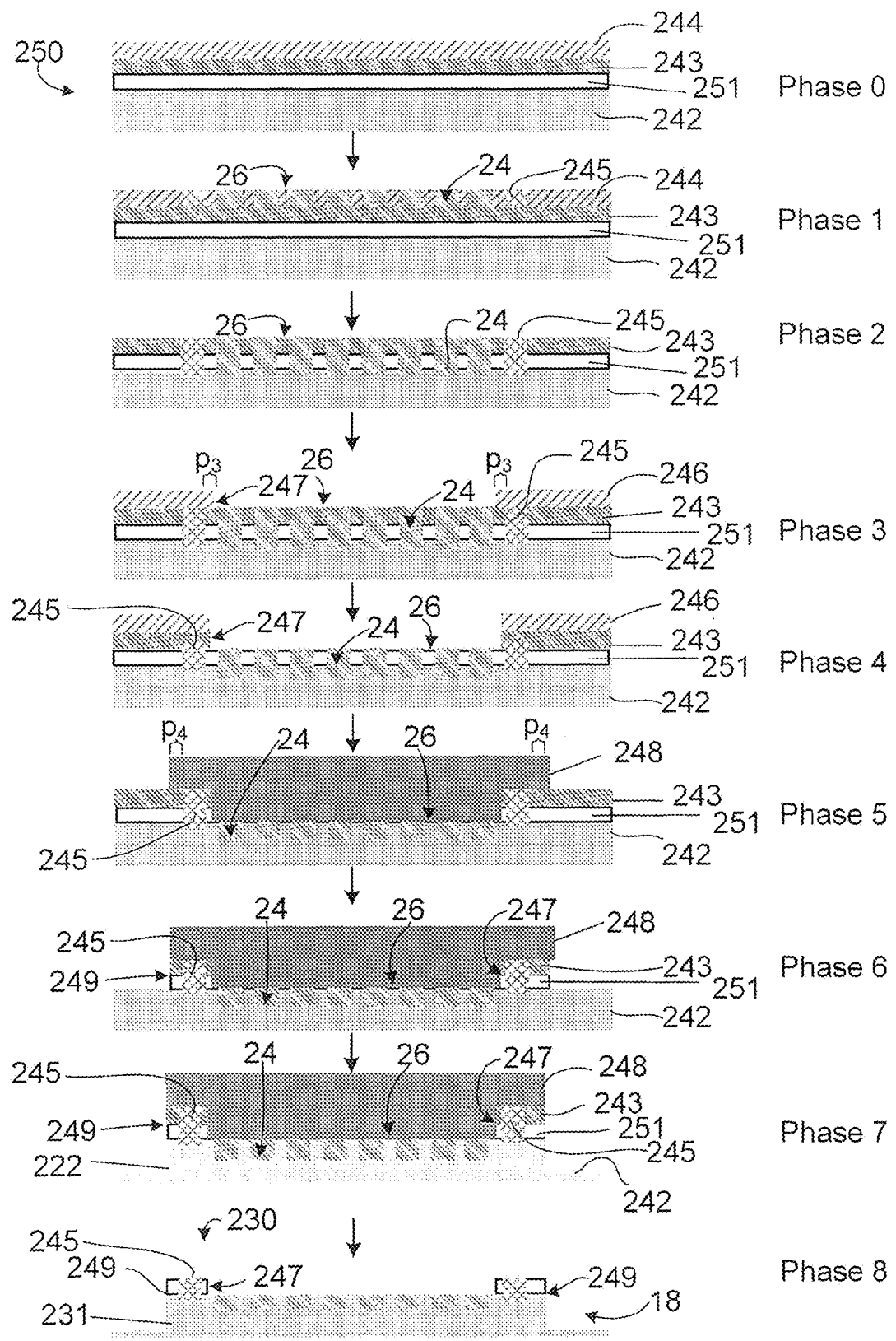
FIG. 25 illustrates simplified side views of another exemplary template formation of the template shown in FIG. 23.

FIG. 25 illustrates simplified side views of another exemplary template formation of template 18 shown in FIG. 23. Template 18 may be formed from a multi-layer substrate 250, (see Phase 0). The resulting template 18 (see Phase 8) formed from multi-layer substrate 250 includes mesa 231 having gasket 230.

The multi-layer substrate 250 includes a resist 242, a hard mask layer 243 (e.g., Cr), an oxide layer 244 (e.g., SiO2), and a gasket layer 251. Gasket layer 251 may be formed from such materials including, but not limited to, fused-silica, quartz, silicon, organic polymers, siloxane polymers, borosilicate glass, fluorocarbon polymers, metal, hardened sapphire, and/or the like. Gasket layer 251 may be formed from, but is not limited to, materials similar to resist 242 and/or hard mask 243.

During lithography Phase 1, oxide layer 243 may be patterned to include primary features (e.g. recessions 24 and protrusions 26) and/or alignment marks 245. Primary features 24 and 26 and/or alignment marks 245 may be further etched into hard mask layer 243, gasket layer 251, and resist 242, shown in Phase 2. During lithography Phase 3, alignment marks 245 may be substantially shielded by second resist 246. Additionally, second resist 246 may linearly extend a portion p3 from alignment marks 245 to form an inner perimeter 247 of gasket 230. With the second resist 246 substantially shielding alignment marks 245, primary features 24 and 26 are further etched into resist 242 (see Phase 4). During lithography Phase 5, alignment marks 245 may be substantially shielded by third resist 248. Additionally, third resist 248 may linearly extend a portion p4 from alignment marks 245 to form an outer perimeter 249 of gasket 230, shown in Phase 6. In Phases 6 and 7, sidewalls 222 of mesa 231 may be formed by methods further described in U.S. application Ser. No. 11/762,278, which is herein incorporated by reference. The resulting template 18 includes mesa 231 having gasket 230 surrounding alignment marks 245.

Figure 26:
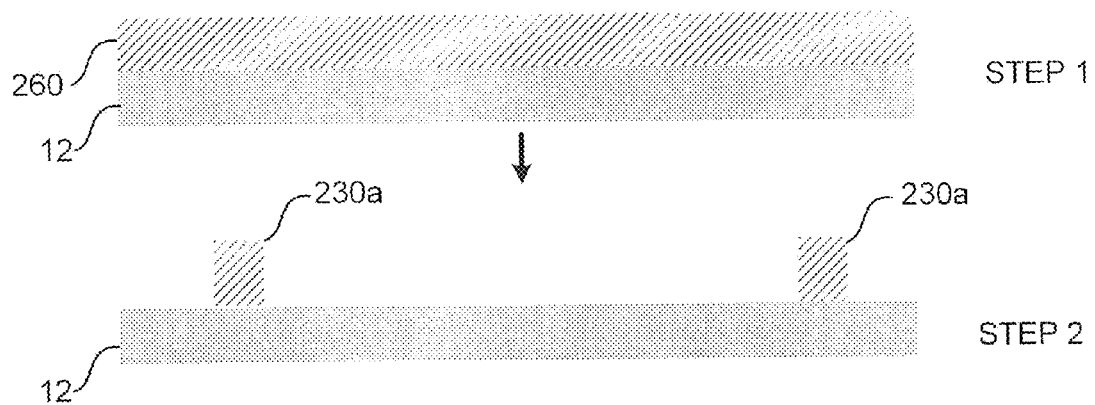
FIG. 26 illustrates simplified side views of a substrate having a gasket formed thereon.

In another embodiment, gasket 230a may be formed on substrate 12 as illustrated in FIG. 26. In Step 1, polymeric material 260 may be deposited on substrate 12. Polymeric material 260 may be substantially similar to polymeric material 34 and/or any material capable of forming gasket 230a as described in more detail below. Polymeric material 260, once deposited on substrate 12, may then be cured and lithographed, and/or patterned, forming gasket 230a in Step 2. Gasket 230a may be a continuous raised perimeter formed around an edge of the field of substrate 12. In an example, height of gasket 230a may be about 5 nm less than a residual layer thickness t1 (shown in FIG. 2).

Figure 27:
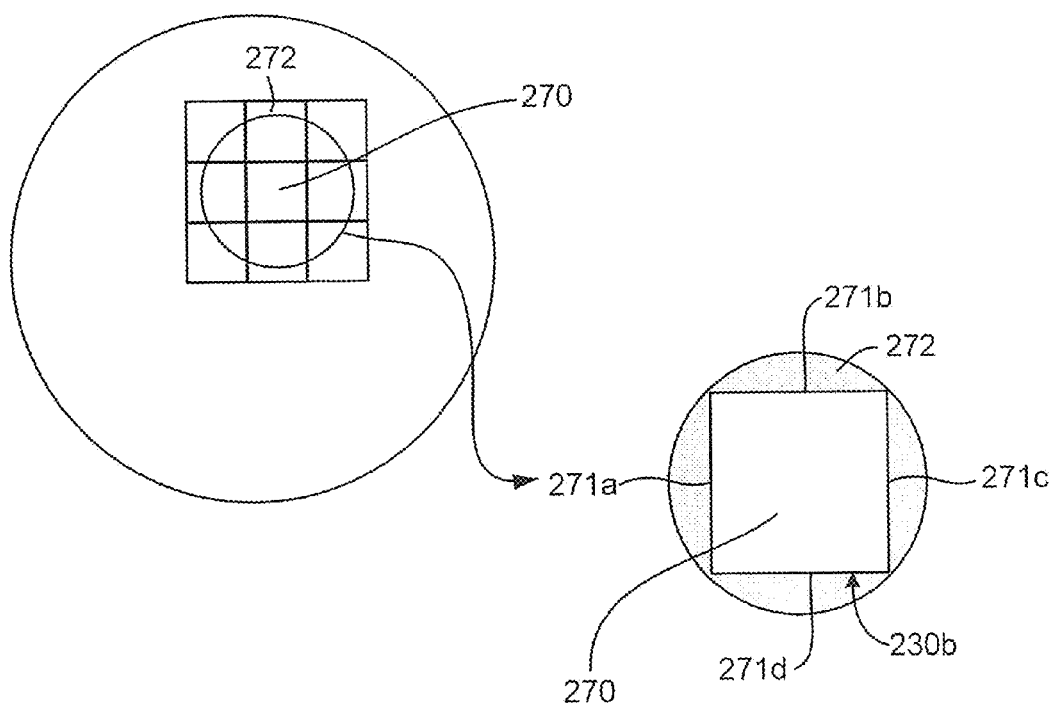
FIG. 27 illustrates a top down view of a substrate having multiple fields forming a gasket.
Figure 28:
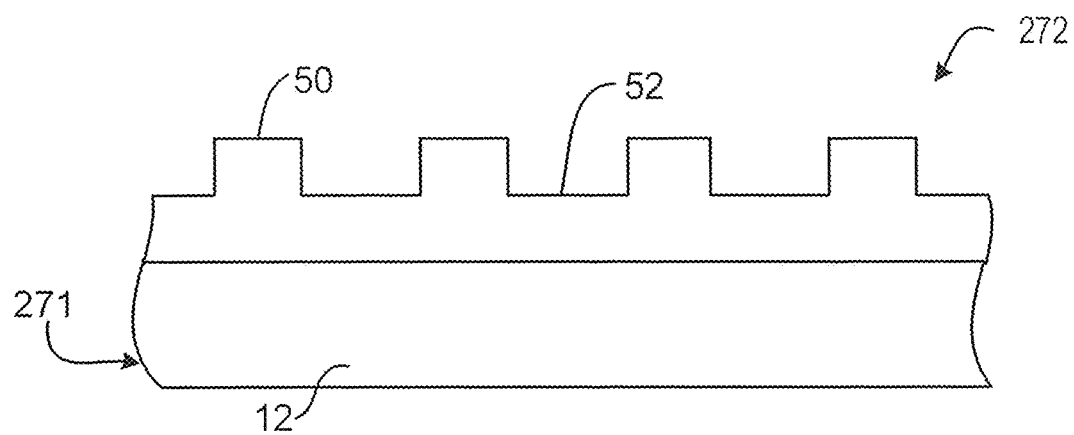
FIG. 28 illustrates a side view of a prior form field illustrated in FIG. 26.

In another embodiment, as illustrated in FIGS. 27 and 28, gaskets 230b are formed in field 270 by adjacent, edges 271a-271d of prior formed fields 272 on substrate 12. Each prior formed field 272 and associated edge 271 may be formed using imprint lithography process described in detail in U.S. Pat. No. 6,932,934, U.S. Patent Publication No. 2004/0124566, U.S. Patent Publication No. 2004/0188381, and U.S. Patent Publication No. 2004/0211754, all of which are herein incorporated by reference. Each edges 271a-271d of the prior formed fields 272 form gaskets 230b by blocking flow of polymeric material 34 (not shown) deposited in field 272. Specifically, each edge 271a-d of prior formed fields 272 surrounding 270 significantly reduce extrusion of polymeric material 34 (not shown) deposited in field 270.

What is claimed is:

1. A method of forming a porous nano-imprint lithography template, the method comprising:
   forming a nano-imprint lithography mask on a fused silica nano-imprint lithography template;
   etching the nano-imprint lithography template to form recesses in the template;
   adjusting a volume of the recesses;
   cleaning the nano-imprint lithography template;
   depositing a conformal oxide layer over the recesses;
   removing a top portion of the conformal oxide layer to leave conformal oxide plugs in the recesses; and
   etching the conformal oxide plugs to predetermined depth.

2. The method of claim 1, further comprising protecting side walls of the recesses before adjusting a volume of the recesses.

3. The method of claim 1, wherein adjusting a volume of the recesses comprises isotropically etching a bottom of the recesses to enlarge a volume of the recesses.

* * * * *